United States Patent
Dornel

(10) Patent No.: US 8,901,654 B1
(45) Date of Patent: Dec. 2, 2014

(54) SEMICONDUCTOR-ON-INSULATOR (SOI) FIELD EFFECT TRANSISTOR WITH BURIED EPITAXIAL ACTIVE REGIONS

(71) Applicant: International Business Machines Corporation, Armonk, NY (US)

(72) Inventor: Erwan Dornel, Fontaine (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/938,263

(22) Filed: Jul. 10, 2013

(51) Int. Cl.
  *H01L 27/12* (2006.01)
  *H01L 29/06* (2006.01)
  *H01L 29/66* (2006.01)
  *H01L 29/78* (2006.01)

(52) U.S. Cl.
  CPC ............ *H01L 29/78* (2013.01); *H01L 29/0649* (2013.01); *H01L 29/66477* (2013.01)
  USPC .......................................... 257/347; 438/300

(58) Field of Classification Search
  CPC ................... H01L 29/66628; H01L 29/78618; H01L 29/66636; H01L 29/267; H01L 29/666759; H01L 29/785; H01L 29/78
  See application file for complete search history.

(56) References Cited

U.S. PATENT DOCUMENTS

| | | | |
|---|---|---|---|
| 7,479,437 B2 | 1/2009 | Greene et al. | |
| 8,106,456 B2 * | 1/2012 | Khater | 257/347 |
| 2006/0131648 A1 | 6/2006 | Ahn et al. | |
| 2007/0161169 A1 | 7/2007 | Belyansky et al. | |
| 2007/0284654 A1 | 12/2007 | Rubino et al. | |
| 2009/0039426 A1 | 2/2009 | Cartier et al. | |

OTHER PUBLICATIONS

Ahn, C.G. et al., "Recessed Source-drain (S/D) SOI MOSFETs with Low S/D Extension (SDE) External Resistance" IEEE International SOI Conference (Oct. 4-7, 2004) pp. 207-208.

Ahn, C.G. et al., "30-nm Recessed S/D SOI MOSFET With an Ultrathin Body and a Low SDE Resistance" IEEE Electron Device Letters (Jul. 2005) pp. 486-488, vol. 26, No. 7.

Cheng, K. et al., "Extremely Thin SOI (ETSOI) Technology: Past, Present, and Future" IEEE International SOI Conference (Oct. 11-14, 2010) pp. 1-4.

Cheng, K. et al., "Fully Depleted Extremely Thin SOI Technology Fabricated by a Novel Integration Scheme Featuring Implant-Free, Zero-Silicon-Loss, and Faceted Raised Source/Drain" 2009 Symposium on VLSI Technology Digest of Technical Papers (Jun. 16-18, 2009) pp. 212-213.

(Continued)

*Primary Examiner* — Trung Q Dang
(74) *Attorney, Agent, or Firm* — Scully, Scott, Murphy & Presser, P.C.; H. Daniel Schnurmann

(57) ABSTRACT

A material stack including a semiconductor channel portion, a gate dielectric, a gate electrode, and a gate cap dielectric portion is formed on an insulator layer. The material stack is laterally enclosed by a dielectric spacer including a dielectric material that is different from the dielectric material of the insulator layer. The material stack and the dielectric spacer are undercut by an isotropic etch that removes the material of the insulator layer selective to the material of the dielectric spacer. A selective epitaxy process is employed to deposit a doped semiconductor material, which forms a source region and a drain region that are epitaxially in contact with the semiconductor channel portion. Metal semiconductor alloy portions can be formed on the source region and the drain region.

20 Claims, 23 Drawing Sheets

(56) References Cited

OTHER PUBLICATIONS

Venkatesan, S. et al., "Thin-Film Silicon-on-Insulator (SOI) Device Applications of Selective Epitaxial Growth" IEEE International SOI Conference (Oct. 5-7, 1993) pp. 76-77.

Khakifirooz, A. et al., "Challenges and opportunities of extremely thin SOI (ETSOI) CMOS technology for future low power and general purpose system-on-chip applications" 2010 International Symposium on VLSI Technology Systems and Applications (VLSI-TSA) (Apr. 26-28, 2010) pp. 110-111.

* cited by examiner

SEMICONDUCTOR-ON-INSULATOR (SOI) FIELD EFFECT TRANSISTOR WITH BURIED EPITAXIAL ACTIVE REGIONS

BACKGROUND

The present disclosure relates to semiconductor structures, and particularly to semiconductor-on-insulator (SOI) field effect transistors with buried epitaxial active regions and methods of manufacturing the same.

Extremely thin semiconductor-on-insulator (ETSOI) semiconductor devices are fabricated on a very thin semiconductor layer, which typically has a thickness in a range from 2 nm to 30 nm. The thickness of the thin semiconductor layer is insufficient for formation of metal semiconductor alloy materials (such as metal silicide materials) employing conventional technology.

While formation of raised source and drain regions have been proposed as a potential solution, raised source and drain regions tend to have an undesirable effect of increasing Miller capacitance, which is the capacitance between a gate electrode and the source and drain regions. Another solution that employs polycrystalline source and drain regions has the undesirable effect of increasing on-resistance due to the grain boundaries that are inherently present in the polycrystalline semiconductor material.

BRIEF SUMMARY

A material stack including a semiconductor channel portion, a gate dielectric, a gate electrode, and a gate cap dielectric portion is formed on an insulator layer. The material stack is laterally enclosed by a dielectric spacer including a dielectric material that is different from the dielectric material of the insulator layer. The material stack and the dielectric spacer are undercut by an isotropic etch that removes the material of the insulator layer selective to the material of the dielectric spacer. A selective epitaxy process is employed to deposit a doped semiconductor material, which forms a source region and a drain region that are epitaxially in contact with the semiconductor channel portion. Metal semiconductor alloy portions can be formed on the source region and the drain region.

According to an aspect of the present disclosure, a semiconductor structure includes an insulator layer including a vertically protruding portion, and a semiconductor channel portion having a uniform thickness, contacting a top surface of the vertically protruding portion, and laterally protruding outward from the top surface of the vertically protruding portion. The semiconductor structure further includes a gate stack including, from bottom to top, a gate dielectric and a gate electrode and contacting a top surface of the semiconductor channel portion. An epitaxial source region contacts a first concave sidewall of the vertically protruding portion and is epitaxially in contact with the semiconductor channel portion, and an epitaxial drain region contacts a second concave sidewall of the vertically protruding portion and is epitaxially in contact with the semiconductor channel portion.

According to another aspect of the present disclosure, a method of forming a semiconductor structure is provided. A gate stack is formed over a semiconductor-on-insulator (SOI) substrate, which includes a top semiconductor layer, a buried insulator layer, and a handle substrate. A semiconductor channel portion is formed by patterning the top semiconductor layer. The semiconductor channel portion underlies the gate stack, and a top surface of the buried insulator layer is physically exposed in regions not covered by the semiconductor channel portion. A dielectric spacer is formed around the gate stack and the semiconductor channel portion. An isotropic etch of the buried insulator layer is performed employing the dielectric spacer as an etch mask. Peripheral regions of a bottom surface of the semiconductor channel portion are physically exposed. A semiconductor material is deposited directly on the physically exposed peripheral regions of the bottom surface of the semiconductor channel portion.

DETAILED DESCRIPTION

Figure 1:
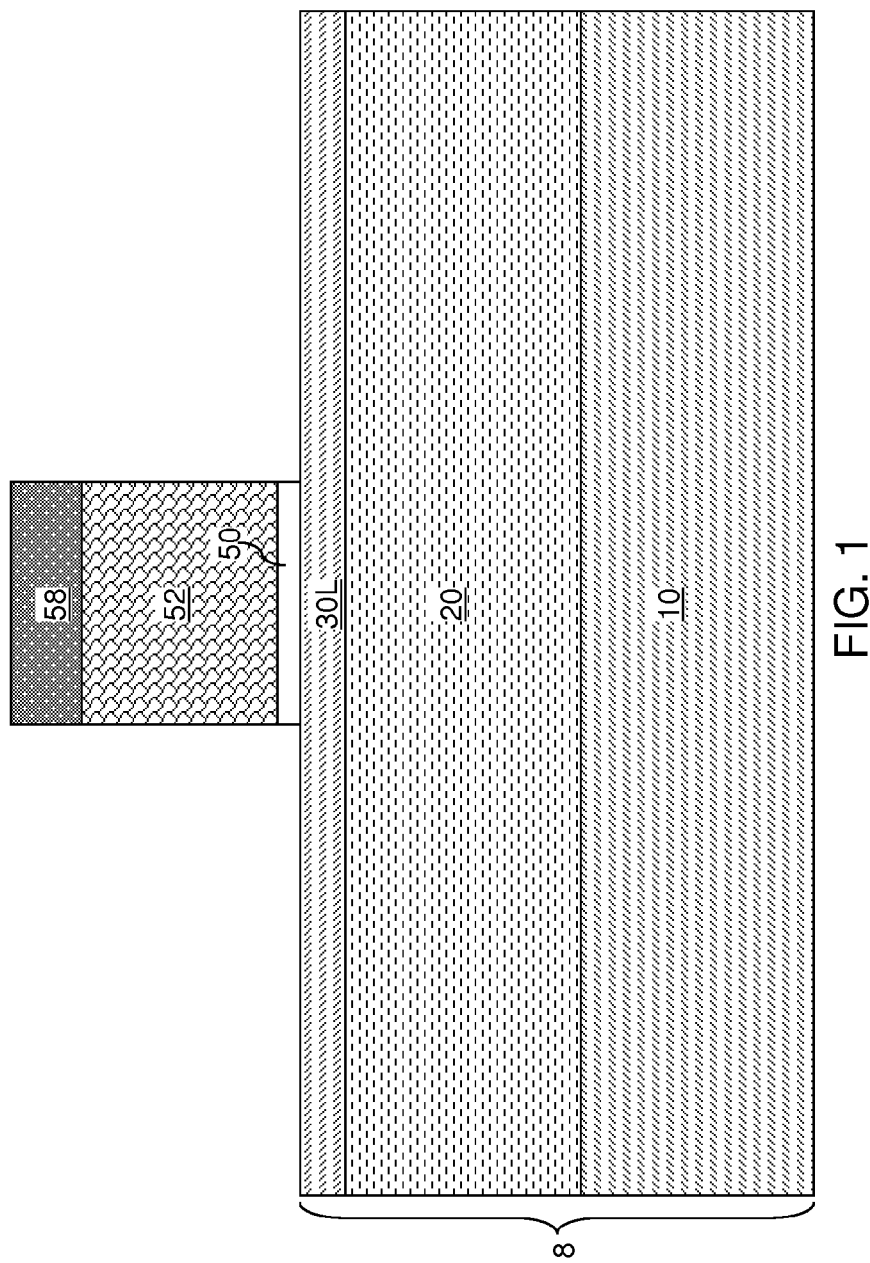
FIG. 1 is a vertical cross-sectional view of a first exemplary semiconductor structure after formation of a gate stack structure according to a first embodiment of the present disclosure.

As stated above, the present disclosure relates to semiconductor-on-insulator (SOI) field effect transistors with buried epitaxial active regions and methods of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIG. 1, a first exemplary semiconductor according to a first embodiment of the present disclosure includes a semiconductor substrate 8. The semiconductor substrate 8 can be a semiconductor-on-insulator (SOI) substrate including a stack of a handle substrate 10, a buried insulator layer 20, and a top semiconductor layer 30L. The handle substrate 10 can include a semiconductor material, an insulator material, a conductive material, or a combination thereof. The handle substrate 10 provides structural support to the semiconductor substrate 8 during mechanical handling. The buried insulator layer 20 includes a dielectric material such as silicon oxide, silicon nitride, silicon oxynitride, or a combination thereof. The thickness of the buried insulator layer 20 can be from 20 nm to 600 nm, although lesser and greater thicknesses can also be employed. The top semiconductor layer 30L includes a semiconductor material such as silicon, a silicon-germanium alloy, a silicon-carbon alloy, a silicon-germanium-carbon alloy, a III-V compound semiconductor material, a II-VI compound semiconductor material, an alloy thereof, or a stack thereof. The thickness of the top semiconductor layer 30L can be from 5 nm to 300 nm, although lesser and greater thicknesses can also be employed.

In one embodiment, the top semiconductor layer 30L includes a single crystalline semiconductor material. In one embodiment, the top semiconductor layer 30L can be a single crystalline silicon layer. The top semiconductor layer 30L can be intrinsic, doped with p-type dopants, or doped with n-type dopants. If the top semiconductor layer 30L is doped with p-type dopants or n-type dopants, the conductivity type of the doping of the top semiconductor layer 30L is herein referred to as a first conductivity type.

A gate stack is formed on the top surface of the top semiconductor layer 30L. The gate stack can be formed, for example, by depositing a gate dielectric layer and a gate conductor layer, and a gate cap dielectric layer. The vertical stack of the gate dielectric layer, the gate conductor layer, and the gate cap dielectric layer is patterned, for example, by applying a photoresist (not shown) thereupon, lithographically patterning the photoresist, transferring the pattern in the photoresist into the vertical stack, and removing remaining portions of the photoresist. A remaining portion of the gate dielectric layer is a gate dielectric. A remaining portion of the gate conductor layer is a gate electrode 52. A remaining portion of the gate cap dielectric layer is a gate cap dielectric 58. The gate dielectric 50, the gate electrode 52, and the gate cap dielectric 58 collectively constitute a gate stack (50, 52, 58).

The gate dielectric 50 can include any dielectric material that can be employed as a gate dielectric as known in the art. The gate electrode 52 can include any conductive material that can be employed as a gate electrode as known in the art. The gate cap dielectric 58 can include, for example, a dielectric material such as silicon nitride, a dielectric metal nitride, a dielectric metal oxide, a dielectric metal oxynitride, or combinations thereof. In one embodiment, the sidewalls of the gate dielectric 50, the sidewalls of the gate electrode 52, and the sidewalls of the gate cap dielectric 58 can be vertically coincident among one another. As used herein, a first sidewall and a second sidewall are "vertically coincident" if there exists a vertical plane from which the first sidewall and the second sidewall do not deviate by a sum of the surface roughness (as measured in absolute magnitude) of the first sidewall and the surface roughness (as measured in absolute magnitude) of the second sidewall.

Figure 2:
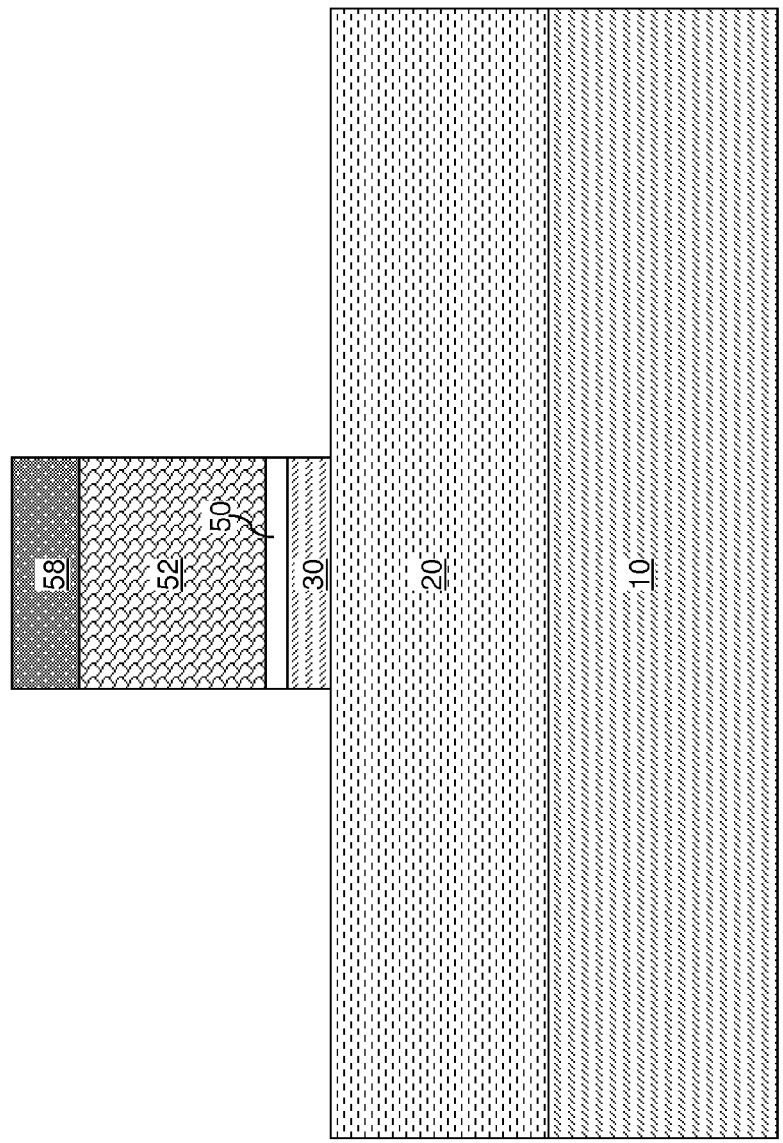
FIG. 2 is a vertical cross-sectional view of the first exemplary semiconductor structure after patterning a top semiconductor layer into a semiconductor channel portion according to the first embodiment of the present disclosure.

Referring to FIG. 2, the top semiconductor layer 30L can be patterned into a semiconductor material portion by an anisotropic etch that employs the gate cap dielectric 58 as an etch mask. Alternately, if a patterned photoresist material portion (nor shown) that is employed to pattern the gate stack (50, 52, 58) is still present above the gate cap dielectric 58, the patterned photoresist material portion can be employed as an etch mask for the anisotropic etch that patterns the top semiconductor layer 30L. The patterned semiconductor material portion is herein referred to as a semiconductor channel portion 30 because the semiconductor portion is employed as a channel of a field effect transistor to be subsequently formed. In one embodiment, the top semiconductor layer 30L can be patterned such that sidewalls of the semiconductor channel portion 30 are vertically coincident with sidewalls of the gate stack (50, 52, 58). The semiconductor channel portion 30 underlies the gate stack (50, 52, 58), and the top surface of the buried insulator layer 20 is physically exposed in regions not covered by the semiconductor channel portion 30. The semiconductor channel portion 30 can have a uniform thickness throughout.

Figure 3:
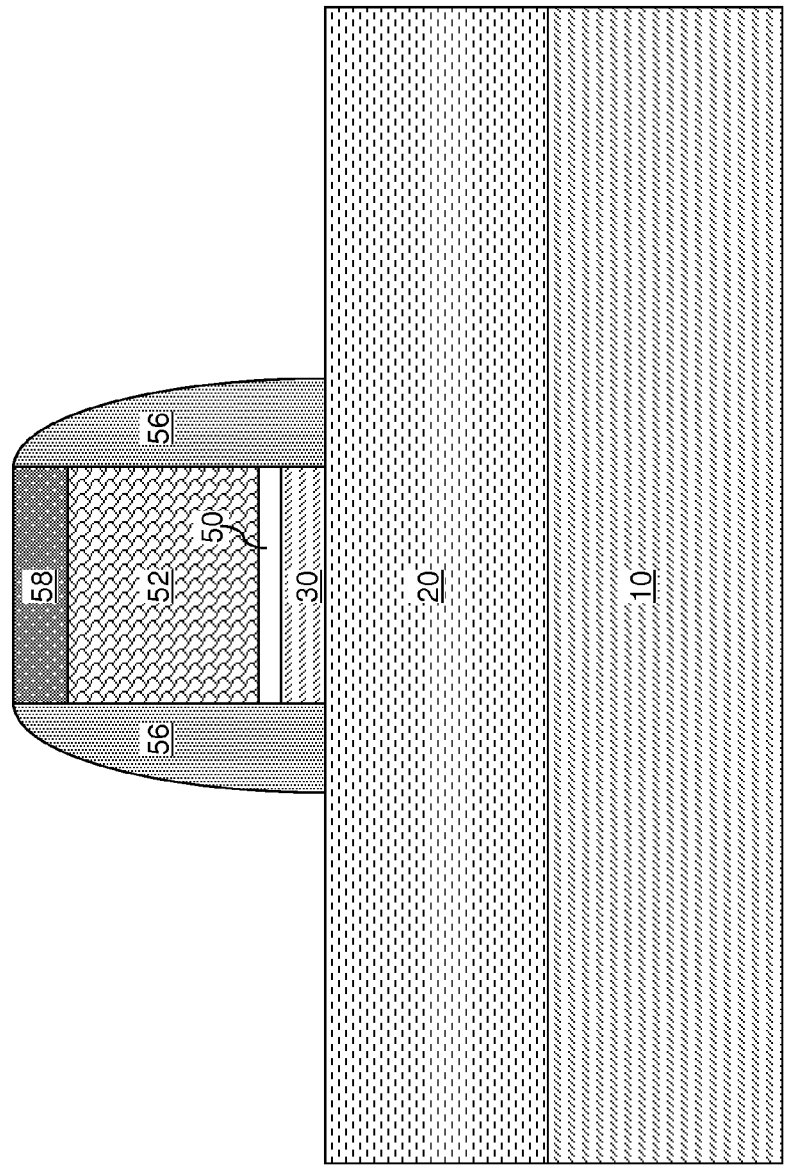
FIG. 3 is a vertical cross-sectional view of the first exemplary semiconductor structure along formation of a dielectric spacer according to the first embodiment of the present disclosure.

Referring to FIG. 3, a dielectric spacer 56 can be formed around the gate stack (50, 52, 58) and the semiconductor channel portion 30 by conformal deposition of a dielectric material layer and an anisotropic etch. The dielectric material layer includes a dielectric material that is different from the dielectric material of the buried insulator layer 20. For example, if the buried insulator layer 20 includes silicon oxide, the dielectric material of the dielectric material layer and the dielectric spacer 56 can include silicon nitride, a dielectric metal oxide, or a dielectric metal nitride. The dielectric material layer can be deposited, for example, by chemical vapor deposition (CVD) or atomic layer deposition (ALD). The anisotropic etch removes horizontal portions of the deposited dielectric material layer. Remaining vertical portions of the dielectric material layer constitutes the dielectric spacer 56. The lateral thickness of the dielectric spacer 56, as measured at the base of the dielectric spacer 56, can be in a range from 5 nm to 100 nm, although lesser and greater thicknesses can also be employed. The bottom surface of the dielectric spacer 56 contacts the top surface of the buried insulator layer 20. As used herein, a "contact" refers to a physical contact between surfaces of two elements.

Figure 4:
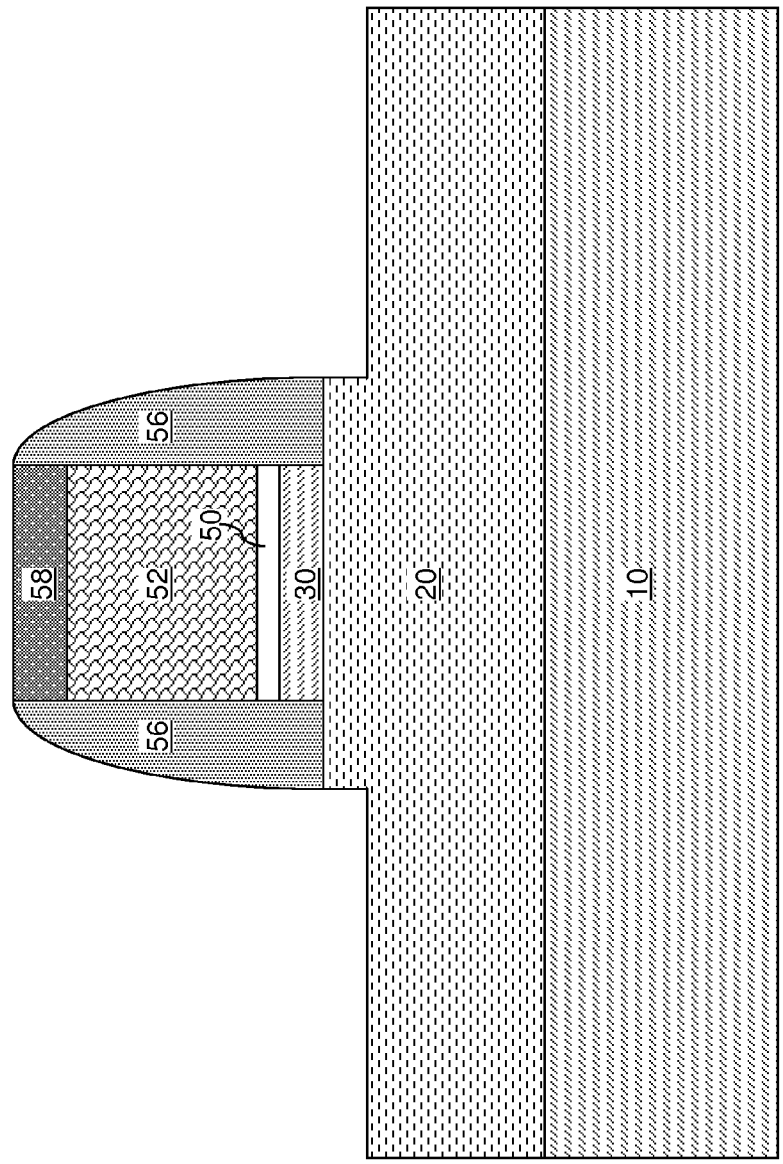
FIG. 4 is a vertical cross-sectional view of the first exemplary semiconductor structure after recessing physically exposed horizontal surfaces of a buried insulator layer by an optional anisotropic etch according to the first embodiment of the present disclosure.

Referring to FIG. 4, physically exposed horizontal top surfaces of the buried insulator layer 20 can be optionally vertically recessed by an anisotropic etch that employs the gate cap dielectric 58 and the dielectric spacer 56 as an etch mask. The depth of recess is less than the difference between the original thickness of the buried insulator layer and the lateral thickness of the dielectric spacer 56, and can be in a range from 3 nm to 100 nm, although lesser and greater depths of recess can also be employed.

Figure 5:
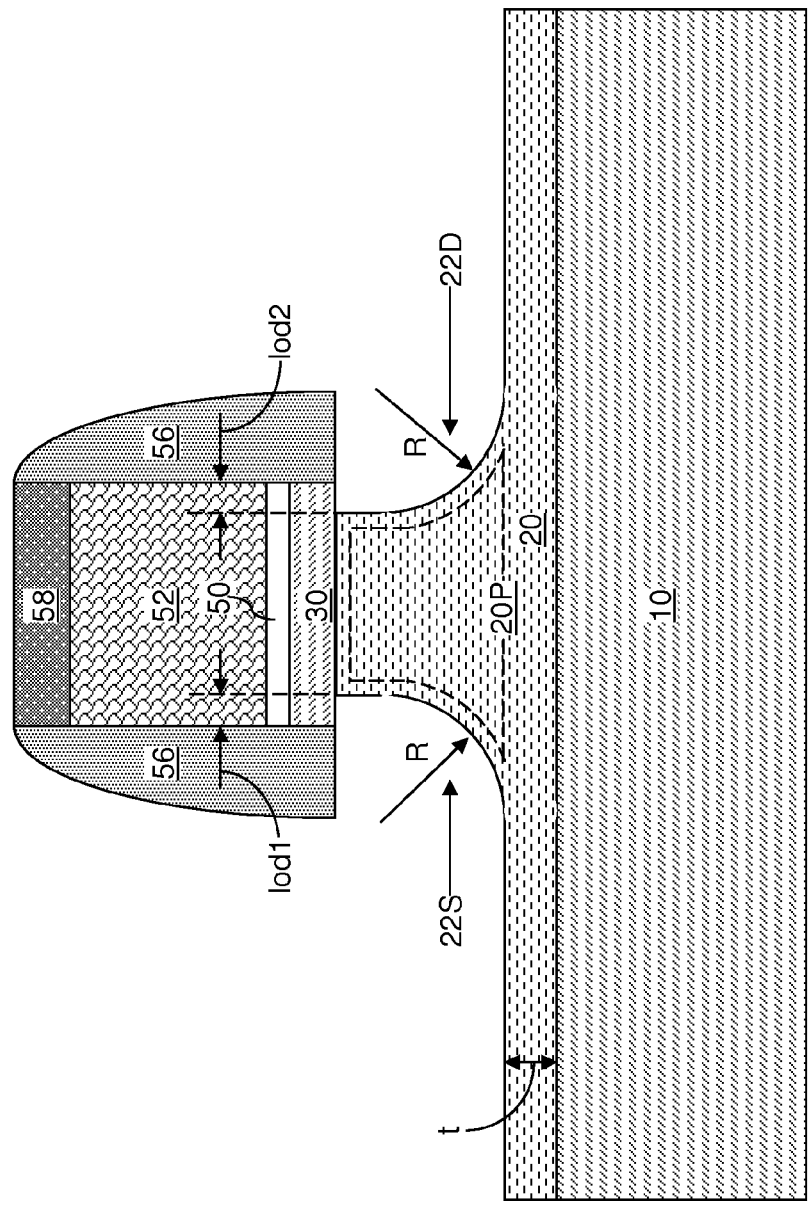
FIG. 5 is a vertical cross-sectional view of the first exemplary semiconductor structure after isotropically etching a buried insulator layer to form undercut regions according to the first embodiment of the present disclosure.

Referring to FIG. 5, the buried insulator layer 20 is isotropically etched to form undercut regions underneath the dielectric spacer 56 and peripheral portions of the semiconductor channel portion 30. The undercut regions include a source-side undercut region 22S that is formed underneath one side of the dielectric spacer 56, and a drain-side undercut region 22D that is formed underneath another side of the dielectric spacer 56. The dielectric spacer 56 and the gate cap dielectric 58 are employed as an etch mask during the isotropic etch. Peripheral portions of the bottom surface of the semiconductor channel portion 30 are physically exposed by the isotropic etch.

The isotropic etch can be a wet etch or a dry etch. If a wet etch is employed as the isotropic etch and the buried insulator layer 20 includes silicon oxide, a wet etch chemistry including hydrofluoric acid can be employed. If a dry etch is employed as the isotropic etch and the buried insulator layer 20 includes silicon oxide, a vapor etch chemistry employing a vapor of hydrofluoric acid can be employed.

The physically exposed surfaces of the buried insulator layer 20 are isotropically recessed. The remaining portion of the buried insulator layer 20 after the anisotropic etch includes a horizontal portion that contacts the top surface of the handle substrate 10 and has a uniform thickness t, and a vertically protruding portion 20P that protrudes above the horizontal portion and contacting the semiconductor channel portion 30. The vertically protruding portion 20P underlies the semiconductor channel portion 30. The vertically protruding portion 20P has a variable horizontal cross-sectional area that increases with distance from the interface between the vertically protruding portion 20P and the semiconductor channel portion 30. The semiconductor channel portion 30 contacts the top surface of the vertically protruding portion 20P, and laterally protrudes outward from the periphery of the top surface of the vertically protruding portion 20P.

The vertically protruding portion 20P includes a first concave sidewall and a second concave sidewall. The first concave sidewall is the sidewall of the vertically protruding portion 20P that is physically exposed to the source-side undercut region 22S, and the second concave sidewall is the sidewall of vertically protruding portion 20P that is physically exposed to the drain-side undercut region 22D. In one embodiment, the source-side undercut region 22S and the drain-side undercut region 22D have a same radius of curvature R. In one embodiment, the radius of curvature R is greater than the lateral thickness of the dielectric spacer 56.

Further, the vertically protruding portion 20P includes vertical sidewalls that laterally surround the topmost portion of the vertically protruding portion 20P and vertically contacting the bottom surface of the semiconductor channel portion 30.

In one embodiment, a first lateral offset distance lod1 between a first sidewall of the semiconductor channel portion 30 (that overlies the source-side undercut region 22S) and an edge at which a vertical sidewall of the vertically protruding portion 20P adjoins the bottom surface of the semiconductor channel portion 30 can be the same as a second lateral offset distance lod2 between a second sidewall of the semiconductor channel portion 30 (that overlies the drain-side undercut region 22D) and an edge at which another vertical sidewall of the vertically protruding portion 20P adjoins the bottom surface of the semiconductor channel portion 30. In one embodiment, the radius of curvature R can be the same as the sum of the lateral thickness of the dielectric spacer 56 and the first lateral offset distance lod1, which is the same as the sum of the lateral thickness of the dielectric spacer 56 and the second lateral offset distance lod2. The buried insulator layer 20 includes a planar surface that is adjoined to a bottommost portion of the first concave sidewall and another planar surface that is adjoined to a bottommost portion of the second concave sidewall. The planar surfaces of the buried insulator layer 20 can be parallel to the interface between the vertically protruding portion 20P and the semiconductor channel portion 30.

Figure 6:
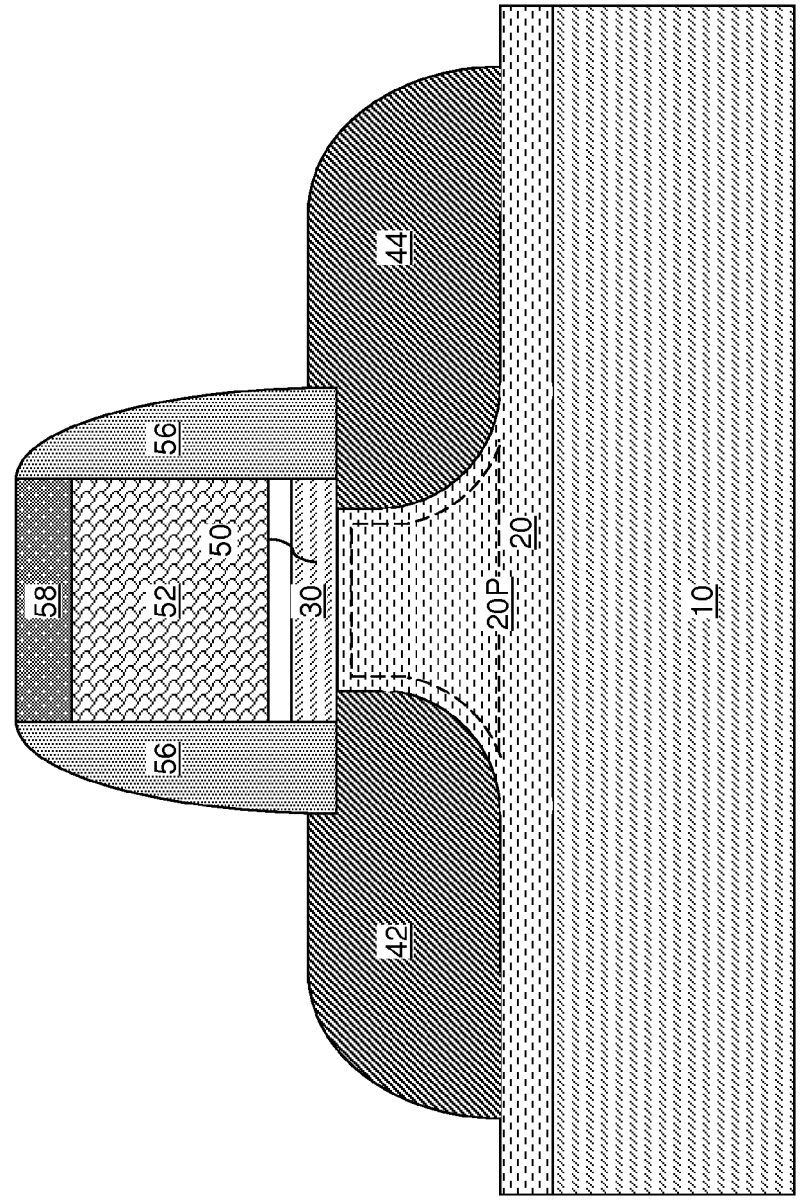
FIG. 6 is a vertical cross-sectional view of the first exemplary semiconductor structure after formation of buried active epitaxial regions according to the first embodiment of the present disclosure.

Referring to FIG. 6, buried active epitaxial regions are formed by a selective epitaxy process. As used herein an "active epitaxial region" refers to a p-doped or n-doped semiconductor region having a single crystalline structure and epitaxially in contact with another single crystalline region. As used herein, a "buried active epitaxial region" refers to an active epitaxial region including a portion that is located below a horizontal plane including a bottommost surface of a channel region of a field effect transistor, which is the semiconductor channel portion 30 in the first exemplary semiconductor structure. The buried active epitaxial regions include an epitaxial source region 42 and an epitaxial drain region 44. The epitaxial source region 42 and the epitaxial drain region 44 grow from the physically exposed peripheral regions of the bottom surface of the semiconductor channel portion 30 during the selective epitaxy process.

During the selective epitaxy process, a doped semiconductor material grows on crystalline semiconductor surfaces, while not growing on amorphous surfaces such as dielectric surfaces. The selective deposition of the semiconductor material can be performed by concurrently or alternately flowing a reactant gas and an etchant gas into a process chamber into which the first exemplary semiconductor structure is loaded. The deposition on single crystalline semiconductor surfaces proceeds without any incubation time, while a finite incubation time for nucleation is required on non-crystalline surfaces. The crystalline surfaces include the physically exposed portions of the bottom surface of the semiconductor channel portion 30. The non-crystalline surfaces include surfaces of the gate cap dielectric 58, the dielectric spacer 56, and the buried insulator layer 20. By selecting an etch rate that is greater than the net nucleation rate on non-crystalline surfaces and less than the deposition rate on crystalline surfaces, a single crystalline semiconductor material can be deposited only on crystalline surfaces and not on non-crystalline surfaces. Thus, the selective epitaxy process can deposit the semiconductor material on semiconductor surfaces, and does not deposit any semiconductor material on dielectric surfaces. The deposited semiconductor material can be, for example, an elemental semiconductor material such as silicon or germanium, an alloy of at least two of silicon, germanium, and carbon, or a III-V compound semiconductor material. The deposited semiconductor material is lattice matched with, or having a lattice mismatch that allows epitaxial deposition on, the singe crystalline semiconductor material of the semiconductor channel portion 30.

Each of the epitaxial source region 42 and the epitaxial drain region 44 is a contiguous single crystalline semiconductor portion including a single crystalline semiconductor structure in epitaxial alignment with the single crystalline structure of the semiconductor channel portion 30. The epitaxial source region 42 and the epitaxial drain region 44 can include a doped semiconductor material that provides an electrical conductive path for conduction of electricity. If the semiconductor channel portion 30 is intrinsic, the epitaxial source region 42 and the epitaxial drain region 44 can be p-doped or n-doped. If the semiconductor channel portion 30 has a doping of a first conductivity type, the epitaxial source region 42 and the epitaxial drain region 44 have a doping of a second conductivity type, which is the same as, or opposite of the first conductivity type.

The selective epitaxy process simultaneously forms the epitaxial source region 42 and the epitaxial drain region 44. The epitaxial source region 42 contacts the first concave sidewall of the vertically protruding portion 2-P, and is epitaxially in contact with the semiconductor channel portion 30. The epitaxial drain region 44 contacts the second concave sidewall of the vertically protruding portion 20P and is epitaxially in contact with the semiconductor channel portion 30. The epitaxial source region 42 and the epitaxial drain region 44 are epitaxially grown to a height above the horizontal plane including the interface between the semiconductor channel portion 30 and the vertically protruding portion 20P. The surfaces of the epitaxial source region 42 and the epitaxial drain region 44 may be, or may not be, faceted depending on the process conditions of the selective epitaxy process. The bottom surfaces of the dielectric spacer 56 are coplanar with the interface between the vertically protruding portion 20P and the semiconductor channel portion 30.

Figure 7:
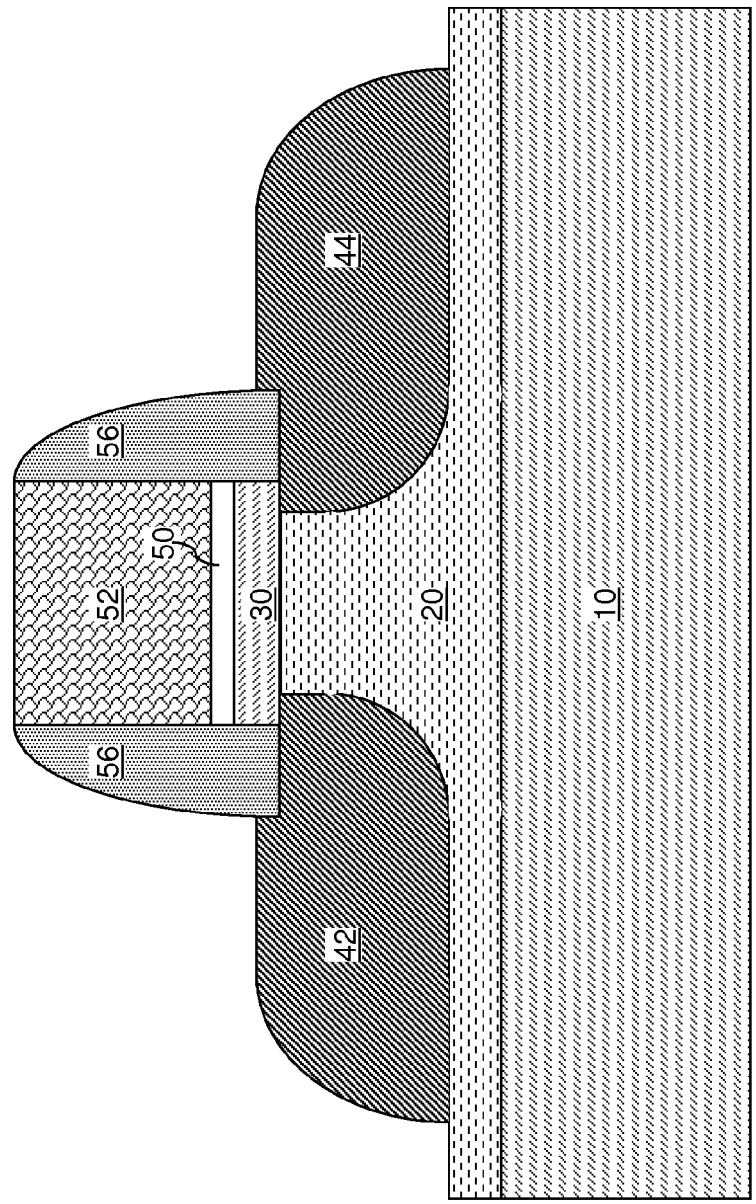
FIG. 7 is a vertical cross-sectional view of the first exemplary semiconductor structure after removal of a gate cap dielectric portion according to the first embodiment of the present disclosure.

Referring to FIG. 7, the gate cap dielectric 58 can be removed, for example, by an anisotropic etch. In one embodiment, the anisotropic etch can be fully or partially selective to the semiconductor material of the epitaxial source region 42 and the epitaxial drain region 44. In one embodiment, if the topmost portion of the gate electrode 52 includes a semiconductor material, a semiconductor surface of the gate electrode 52 can be physically exposed after the anisotropic etch. If the top portion of the gate electrode 52 does not include a semiconductor material, the processing steps of FIG. 7 can be omitted since the gate cap dielectric 58 does not serve a useful purpose in this case.

Figure 8:
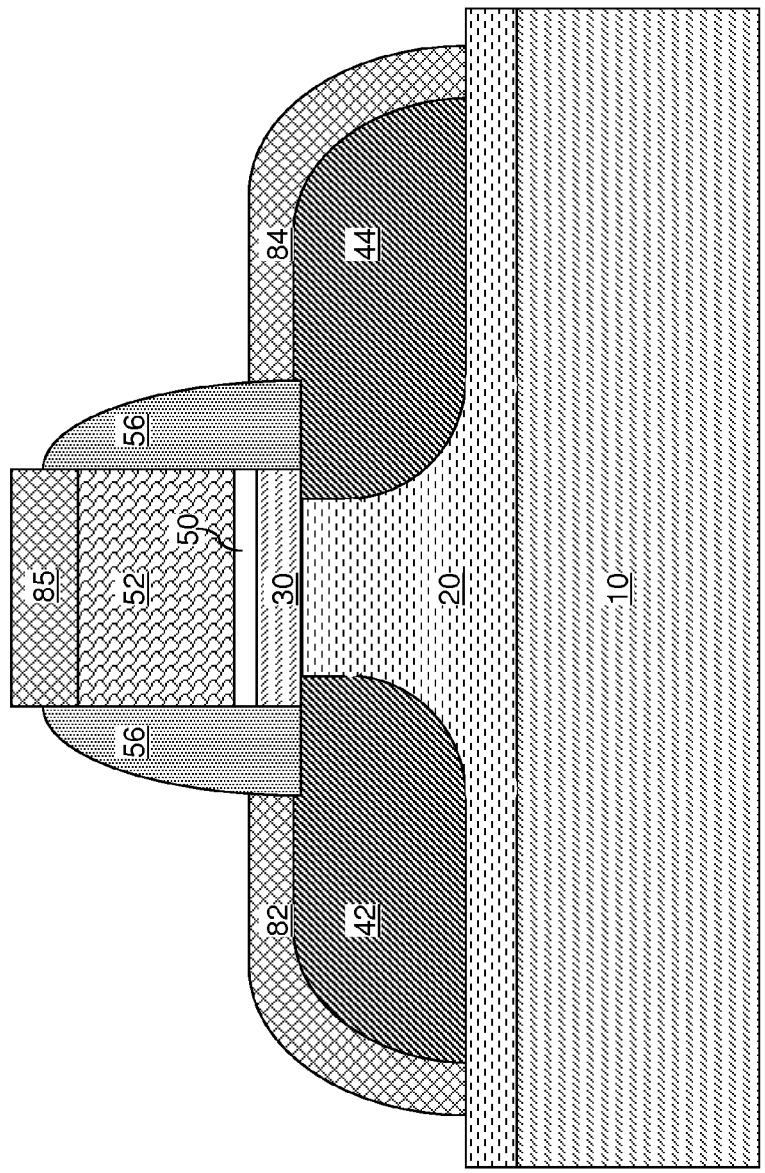
FIG. 8 is a vertical cross-sectional view of the first exemplary semiconductor structure after formation of metal semiconductor alloy regions according to the first embodiment of the present disclosure.

Referring to FIG. 8, metal semiconductor alloy regions can be optionally formed. In one embodiment, the metal semiconductor alloy region can include a source-side metal semiconductor alloy portion 82 that is formed directly on the epitaxial source region 42, a drain-side metal semiconductor alloy portion 84 that is formed directly on the epitaxial drain region 44, and a gate-side metal semiconductor alloy portion 85 that is formed directly on the gate electrode 52. In one embodiment, the metal semiconductor alloy regions (42, 44, 45) can be formed by deposition of a metal layer that reacts with the semiconductor materials of the epitaxial source region 42, the epitaxial drain region 44, and the semiconductor material in the gate electrode 52, and by reacting the metal layer with the underlying semiconductor materials in an anneal at an elevated temperature. The metal layer includes a metal such as Ta, Ti, W, Ni, and/or Pt. Unreacted portions of the metal layer are removed selected to the metal semiconductor alloy regions (42, 44, 45). In one embodiment, the epitaxial source region 42, the epitaxial drain region 44, and the semiconductor material in the gate electrode 52 can include silicon, and the metal semiconductor alloy regions (42, 44, 45) can include metal silicides. A contact level dielectric material layer (not shown) can be subsequently deposited, and various contact via structures (not shown) can be formed therein to provide conductive paths to the metal semiconductor alloy regions (42, 44, 45) through the contact level dielectric material layer.

Figure 9:
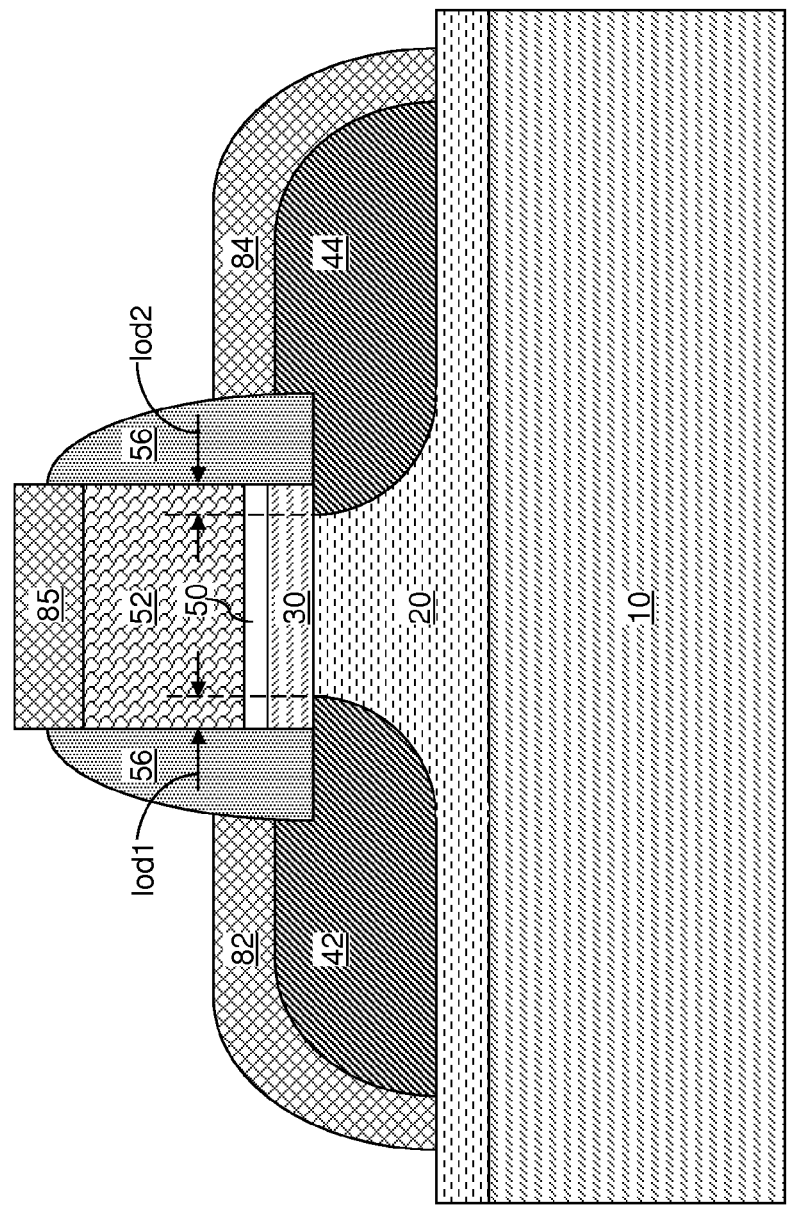
FIG. 9 is a vertical cross-sectional view of a variation of the first exemplary semiconductor structure according to the first embodiment of the present disclosure.

Referring to FIG. 9, a variation of the first exemplary semiconductor structure can be derived from the first exemplary semiconductor structure by omitting the processing step of FIG. 4. A first lateral offset distance lod1 between a first sidewall of the semiconductor channel portion 30 contacting the epitaxial source region 42 and an edge at which the first concave sidewall adjoins the bottom surface of the semiconductor channel portion 30 can be the same as a second lateral offset distance lod2 between a second sidewall of the semiconductor channel portion 30 contacting the epitaxial drain region 44 and an edge at which the second concave sidewall adjoins the bottom surface of the semiconductor channel portion 30. In one embodiment, the radius of curvature R can be the same as the sum of the lateral thickness of the dielectric spacer 56 and the first lateral offset distance lod1, which is the same as the sum of the lateral thickness of the dielectric spacer 56 and the second lateral offset distance lod2. The buried insulator layer 20 includes a planar surface that is adjoined to a bottommost portion of the first concave sidewall and another planar surface that is adjoined to a bottommost portion of the second concave sidewall. The planar surfaces of the buried insulator layer 20 can be parallel to the interface between the vertically protruding portion 20P and the semiconductor channel portion 30.

Figure 10:
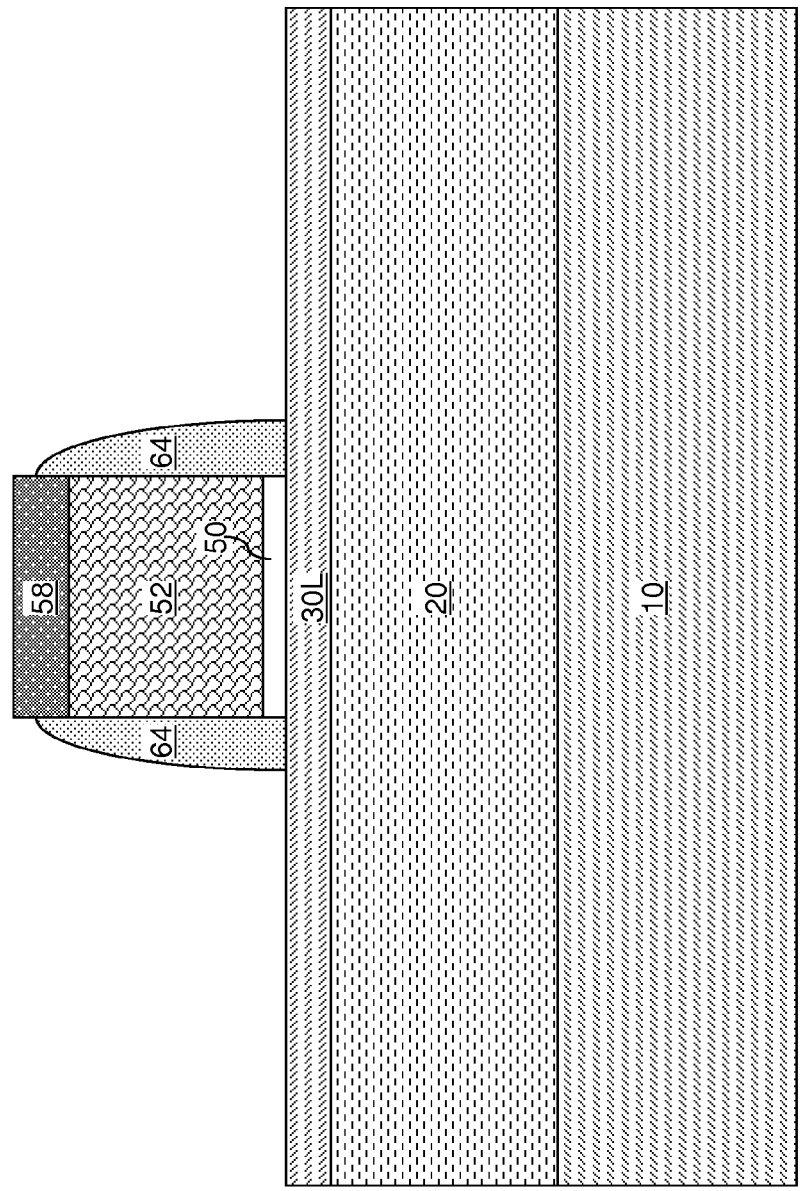
FIG. 10 is a vertical cross-sectional view of a second exemplary semiconductor structure after formation of a gate stack and a first dielectric spacer according to a second embodiment of the present disclosure.

Referring to FIG. 10, a second exemplary semiconductor structure according to a second embodiment of the present disclosure can be derived from the first exemplary semiconductor structure by forming a first dielectric spacer 64 prior to patterning the top semiconductor layer 30L. Specifically, the first dielectric spacer 64 can be formed around the gate stack (50, 52, 58) by conformal deposition of a dielectric material layer and an anisotropic etch. The material of the dielectric material layer may be the same as, or different from, the dielectric material of the buried insulator layer 20. For example, if the buried insulator layer 20 includes silicon oxide, the dielectric material of the dielectric material layer and the first dielectric spacer 64 can include silicon nitride, a dielectric metal oxide, a dielectric metal nitride, or silicon oxide. The dielectric material layer can be deposited, for example, by chemical vapor deposition (CVD) or atomic layer deposition (ALD). The anisotropic etch removes horizontal portions of the deposited dielectric material layer. Remaining vertical portions of the dielectric material layer constitutes the first dielectric spacer 64. The lateral thickness of the first dielectric spacer 64, as measured at the base of the first dielectric spacer 64, can be in a range from 2 nm to 50 nm, although lesser and greater thicknesses can also be employed. The bottom surface of the dielectric spacer 56 contacts the top surface of the top semiconductor layer 30L.

Figure 11:
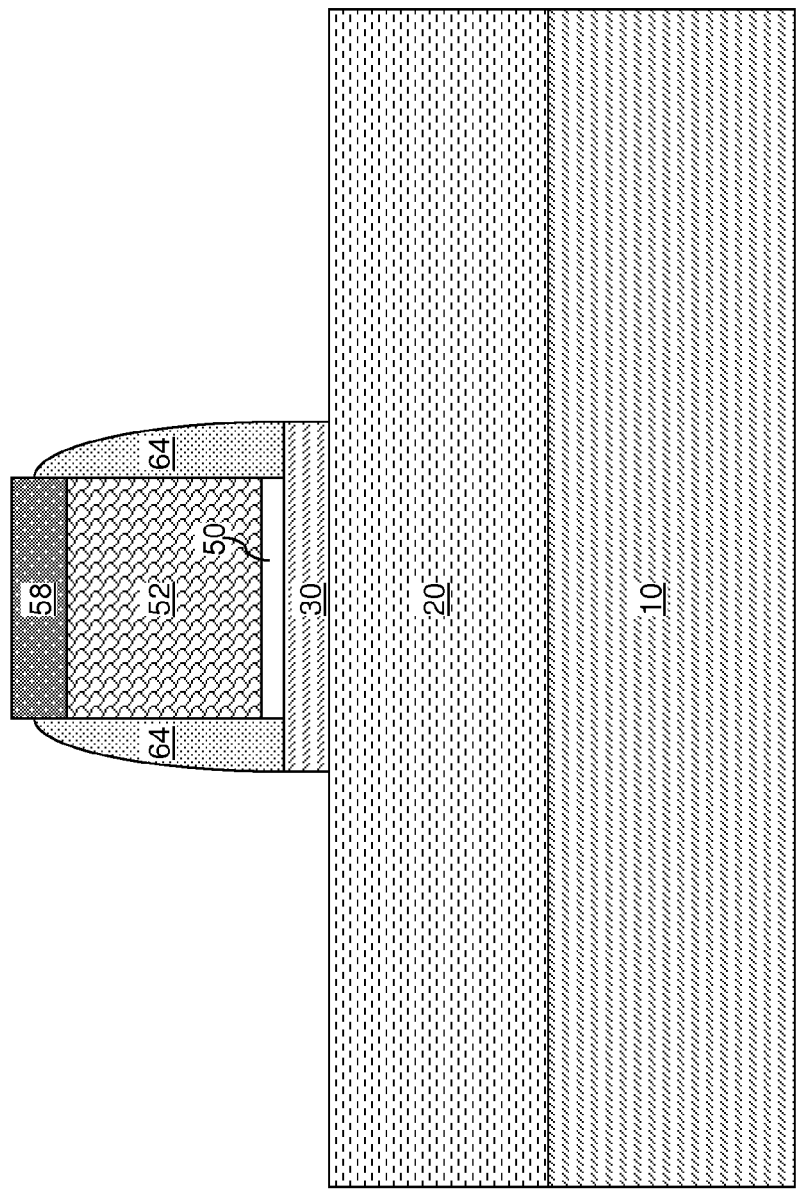
FIG. 11 is a vertical cross-sectional view of the second exemplary semiconductor structure after patterning a top semiconductor layer into a semiconductor channel portion according to the second embodiment of the present disclosure.

Referring to FIG. 11, the top semiconductor layer 30L can be patterned into a semiconductor material portion by an anisotropic etch that employs the combination of the gate cap dielectric 58 and the first dielectric spacer 64 as an etch mask. The patterned semiconductor material portion is herein referred to as a semiconductor channel portion 30 because the semiconductor portion is employed as a channel of a field effect transistor to be subsequently formed. In one embodiment, the top semiconductor layer 30L can be patterned such that sidewalls of the semiconductor channel portion 30 are vertically coincident with outermost portions of outer sidewalls of the first dielectric spacer 64. The semiconductor channel portion 30 underlies the gate stack (50, 52, 58) and the first dielectric spacer 64, and the top surface of the buried insulator layer 20 is physically exposed in regions not covered by the semiconductor channel portion 30. The semiconductor channel portion 30 can have a uniform thickness throughout.

Figure 12:
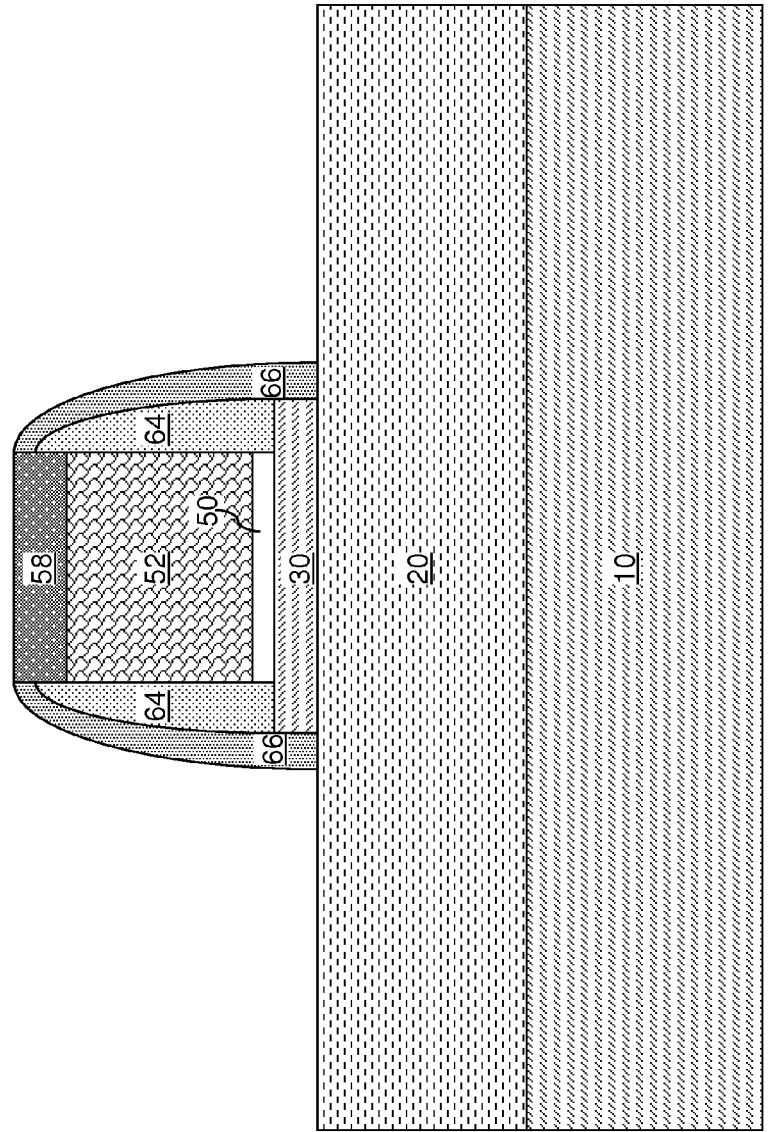
FIG. 12 is a vertical cross-sectional view of the second exemplary semiconductor structure after formation of a second dielectric spacer according to the second embodiment of the present disclosure.

Referring to FIG. 12, a second dielectric spacer 66 can be formed around the gate stack (50, 52, 58), the first dielectric spacer 64, and the semiconductor channel portion 30 by conformal deposition of a dielectric material layer and an anisotropic etch. The dielectric material layer includes a dielectric material that is different from the dielectric material of the buried insulator layer 20. For example, if the buried insulator layer 20 includes silicon oxide, the dielectric material of the dielectric material layer and the second dielectric spacer 66 can include silicon nitride, a dielectric metal oxide, or a dielectric metal nitride. The dielectric material layer can be deposited, for example, by chemical vapor deposition (CVD) or atomic layer deposition (ALD). The anisotropic etch removes horizontal portions of the deposited dielectric material layer. Remaining vertical portions of the dielectric material layer constitutes the second dielectric spacer 66. The lateral thickness of the second dielectric spacer 66, as measured at the base of the second dielectric spacer 66, can be in a range from 5 nm to 80 nm, although lesser and greater thicknesses can also be employed. The bottom surface of the second dielectric spacer 66 contacts the top surface of the buried insulator layer 20.

Figure 13:
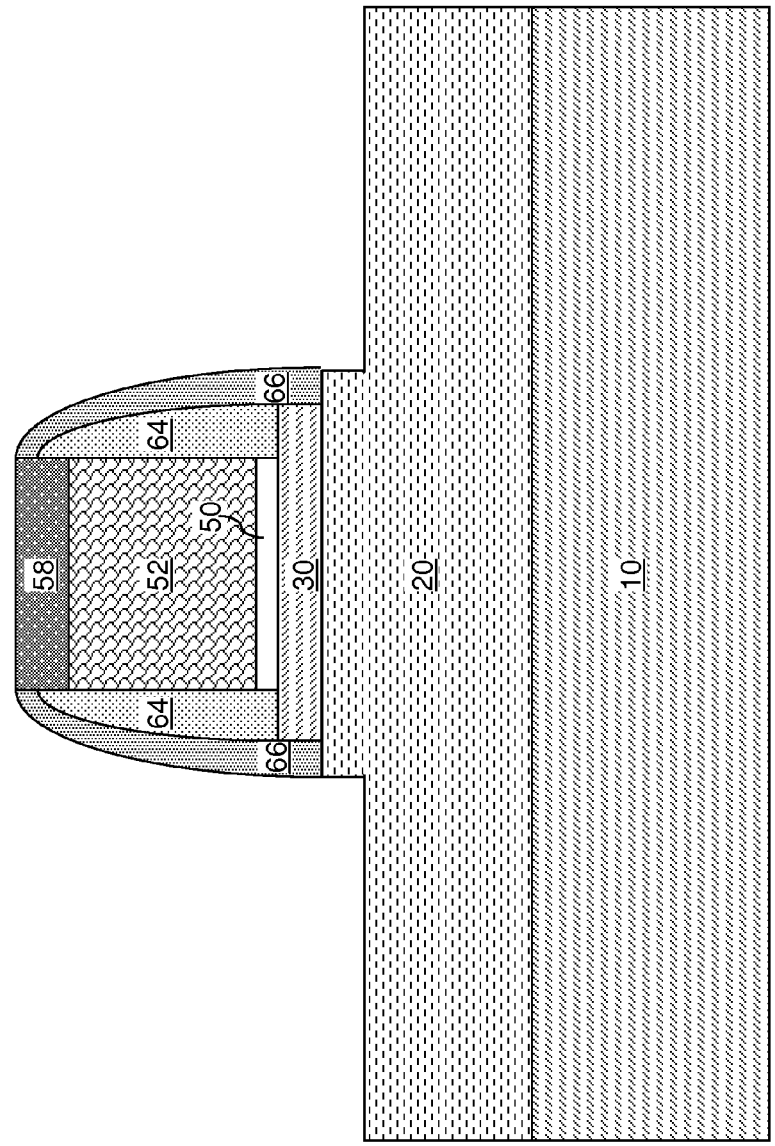
FIG. 13 is a vertical cross-sectional view of the second exemplary semiconductor structure after recessing physically exposed horizontal surfaces of a buried insulator layer by an optional anisotropic etch according to the second embodiment of the present disclosure.

Referring to FIG. 13, physically exposed horizontal top surfaces of the buried insulator layer 20 can be vertically recessed by an anisotropic etch that employs the gate cap dielectric 58 and the second dielectric spacer 66 as an etch mask. The depth of recess is less than the difference between the original thickness of the buried insulator layer and the lateral thickness of the dielectric spacer 56, and can be in a range from 3 nm to 100 nm, although lesser and greater depths of recess can also be employed.

Figure 14:
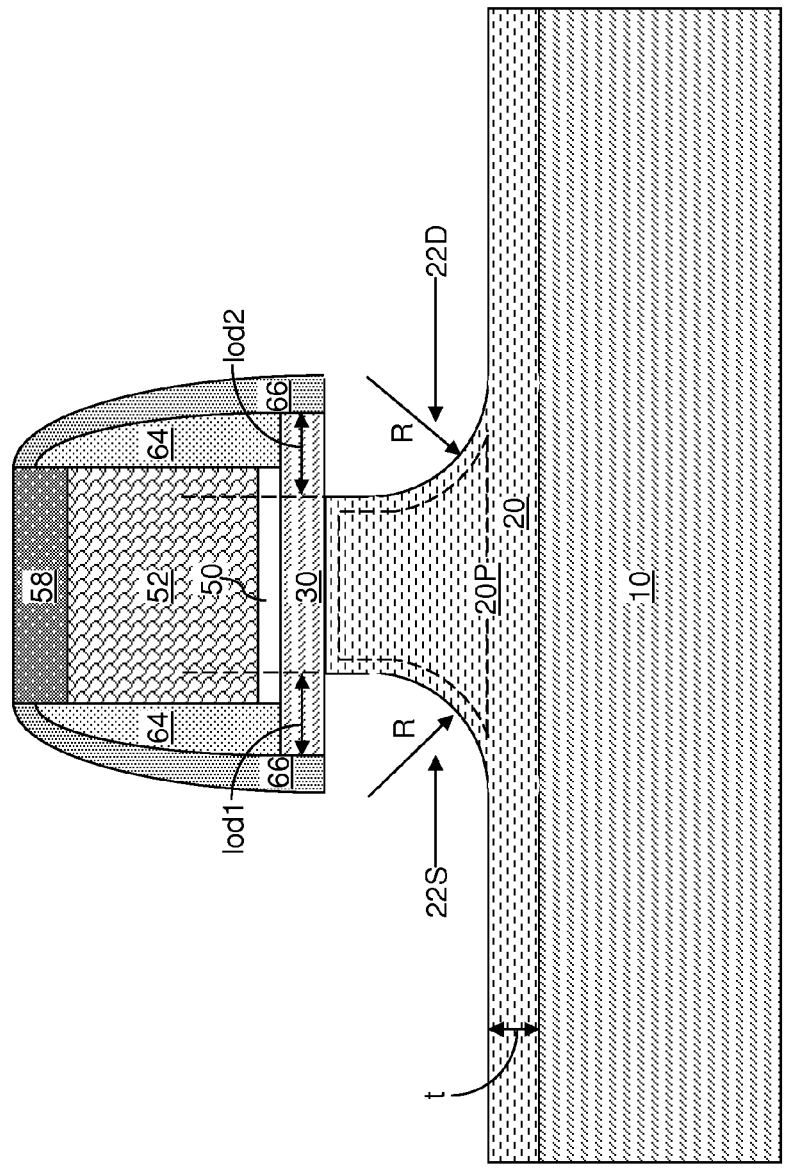
FIG. 14 is a vertical cross-sectional view of the second exemplary semiconductor structure after isotropically etching a buried insulator layer to form undercut regions according to the second embodiment of the present disclosure.

Referring to FIG. 14, the processing steps of FIG. 5 can be performed in the same manner as in the first embodiment. The buried insulator layer 20 is isotropically etched to form undercut regions underneath the second dielectric spacer 66 and peripheral portions of the semiconductor channel portion 30. The undercut regions include a source-side undercut region 22S that is formed underneath one side of the second dielectric spacer 66, and a drain-side undercut region 22D that is formed underneath another side of the second dielectric spacer 66. The second dielectric spacer 66 and the gate cap dielectric 58 are employed as an etch mask during the isotropic etch. Peripheral portions of the bottom surface of the semiconductor channel portion 30 are physically exposed by the isotropic etch.

The physically exposed surfaces of the buried insulator layer 20 are isotropically recessed. The remaining portion of the buried insulator layer 20 after the anisotropic etch includes a horizontal portion that contacts the top surface of the handle substrate 10 and has a uniform thickness t, and a vertically protruding portion 20P that protrudes above the horizontal portion and contacting the semiconductor channel portion 30. The vertically protruding portion 20P underlies the semiconductor channel portion 30. The vertically protruding portion 20P has a variable horizontal cross-sectional area that increases with distance from the interface between the vertically protruding portion 20P and the semiconductor channel portion 30. The semiconductor channel portion 30 contacts the top surface of the vertically protruding portion 20P, and laterally protrudes outward from the periphery of the top surface of the vertically protruding portion 20P.

The vertically protruding portion 20P includes a first concave sidewall and a second concave sidewall. The first concave sidewall is the sidewall of the vertically protruding portion 20P that is physically exposed to the source-side undercut region 22S, and the second concave sidewall is the sidewall of vertically protruding portion 20P that is physically exposed to the drain-side undercut region 22D. In one embodiment, the source-side undercut region 22S and the drain-side undercut region 22D have a same radius of curvature R. In one embodiment, the radius of curvature R is greater than the lateral thickness of the second dielectric spacer 66.

Further, the vertically protruding portion 20P includes vertical sidewalls that laterally surround the topmost portion of the vertically protruding portion 20P and vertically contacting the bottom surface of the semiconductor channel portion 30.

In one embodiment, a first lateral offset distance lod1 between a first sidewall of the semiconductor channel portion 30 (that overlies the source-side undercut region 22S) and an edge at which a vertical sidewall of the vertically protruding portion 20P adjoins the bottom surface of the semiconductor channel portion 30 can be the same as a second lateral offset distance lod2 between a second sidewall of the semiconductor channel portion 30 (that overlies the drain-side undercut region 22D) and an edge at which another vertical sidewall of the vertically protruding portion 20P adjoins the bottom surface of the semiconductor channel portion 30. In one embodiment, the radius of curvature R can be the same as the sum of the lateral thickness of the second dielectric spacer 66 and the first lateral offset distance lod1, which is the same as the sum of the lateral thickness of the second dielectric spacer 66 and the second lateral offset distance lod2. The buried insulator layer 20 includes a planar surface that is adjoined to a bottommost portion of the first concave sidewall and another planar surface that is adjoined to a bottommost portion of the second concave sidewall. The planar surfaces of the buried insulator layer 20 can be parallel to the interface between the vertically protruding portion 20P and the semiconductor channel portion 30.

Figure 15:
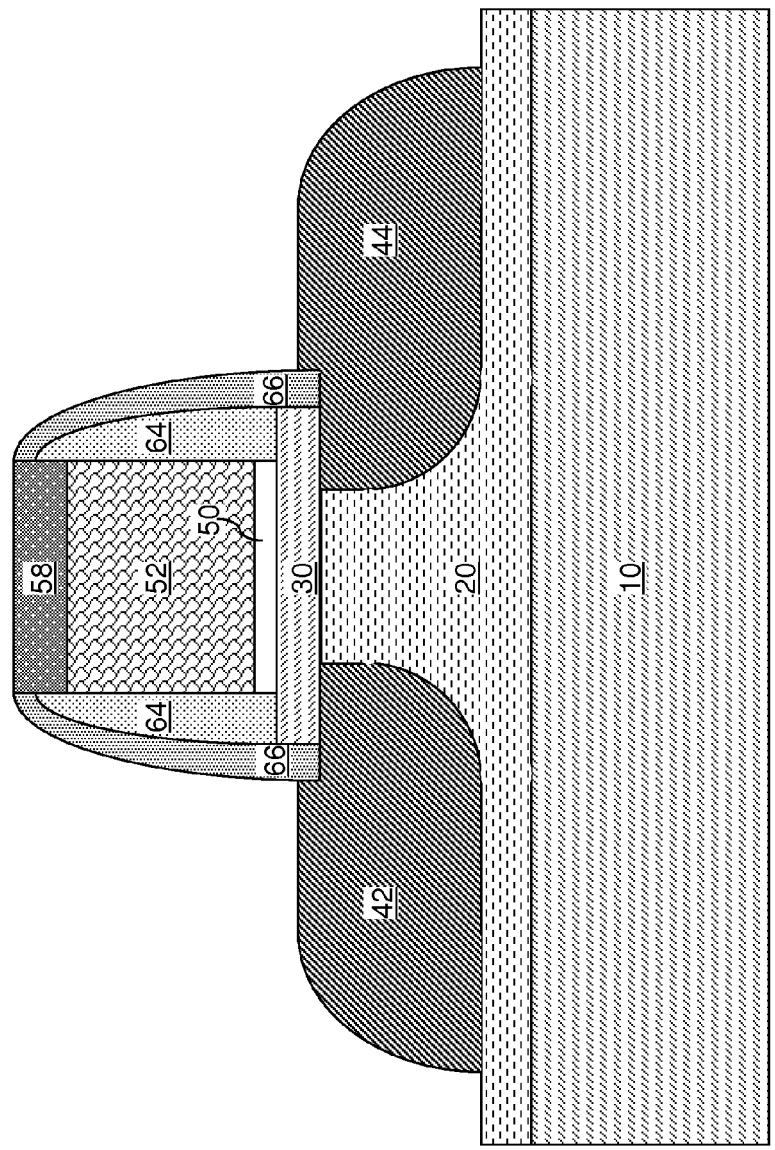
FIG. 15 is a vertical cross-sectional view of the second exemplary semiconductor structure after formation of buried active epitaxial regions according to the second embodiment of the present disclosure.

Referring to FIG. 15, the processing steps of FIG. 6 are performed to form an epitaxial source region 42 and an epitaxial drain region 44 in the same manner as in the first embodiment.

Figure 16:
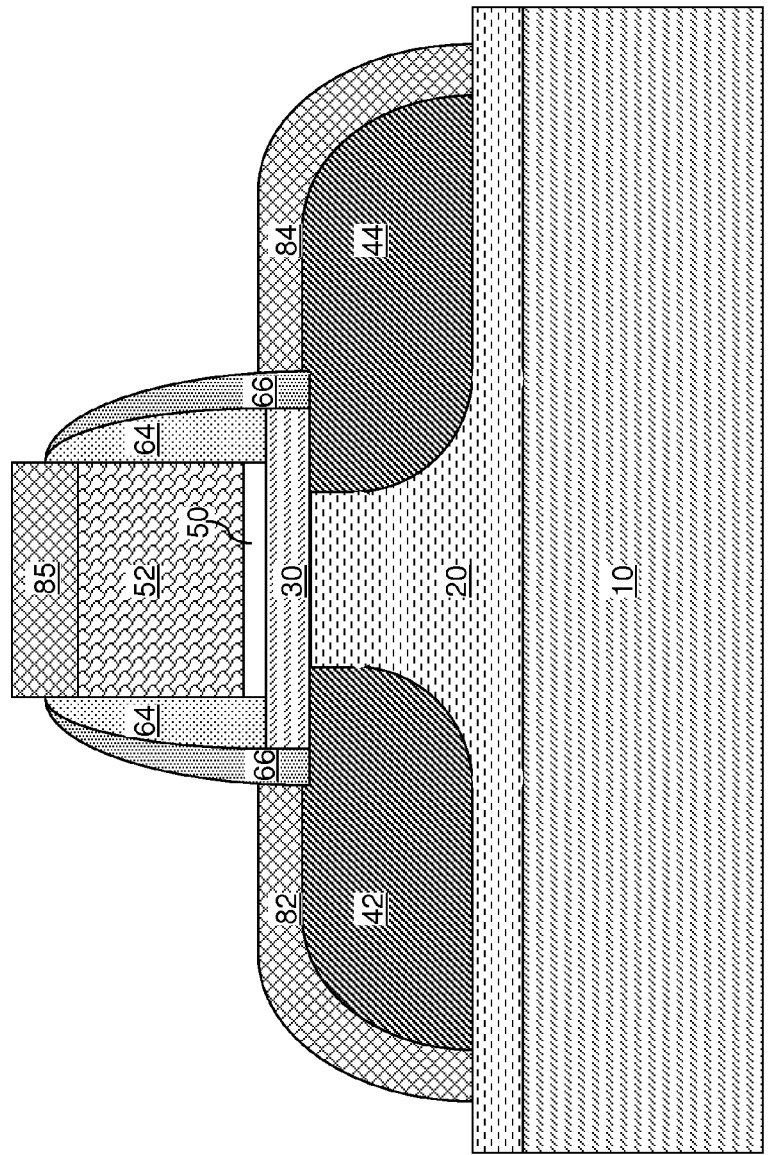
FIG. 16 is a vertical cross-sectional view of the second exemplary semiconductor structure after formation of metal semiconductor alloy regions according to the second embodiment of the present disclosure.

Referring to FIG. 16, the processing steps of FIGS. 6 and 7 are performed to form various metal semiconductor alloy regions (82, 84, 85).

Figure 17:
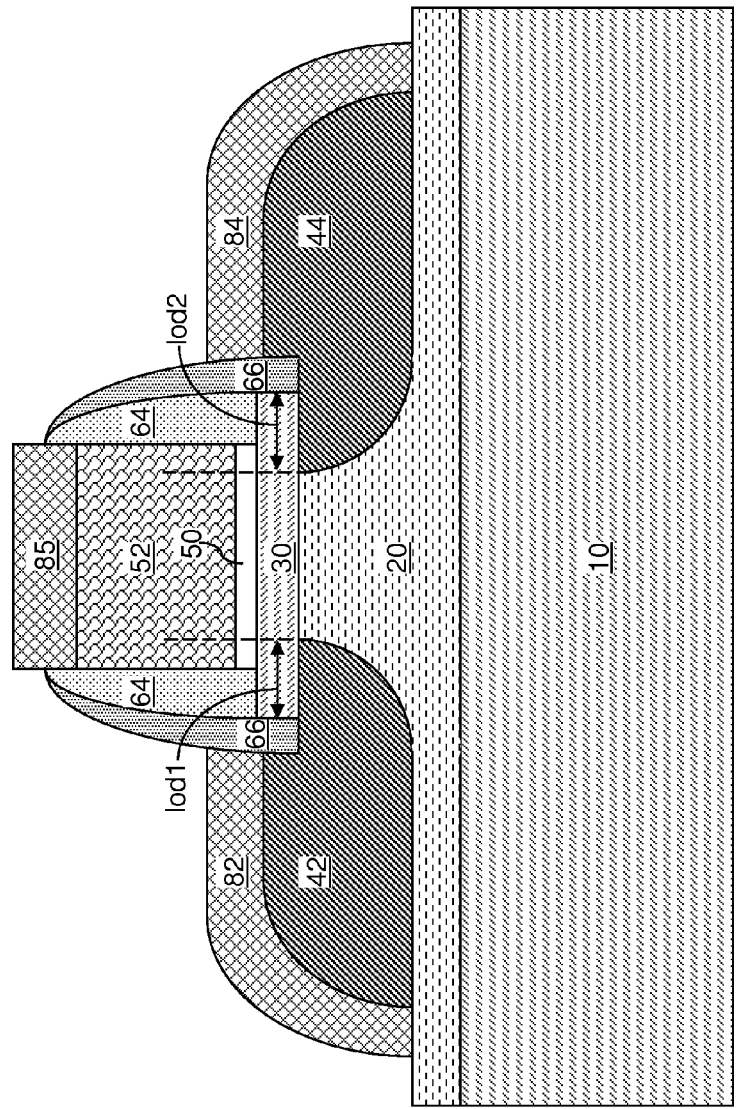
FIG. 17 is a vertical cross-sectional view of a variation of the second exemplary semiconductor structure according to the second embodiment of the present disclosure.

Referring to FIG. 17, a variation of the second exemplary semiconductor structure can be derived from the second exemplary semiconductor structure by omitting the processing step of FIG. 13. A first lateral offset distance lod1 between a first sidewall of the semiconductor channel portion 30 contacting the epitaxial source region 42 and an edge at which the first concave sidewall adjoins the bottom surface of the semiconductor channel portion 30 can be the same as a second lateral offset distance lod2 between a second sidewall of the semiconductor channel portion 30 contacting the epitaxial drain region 44 and an edge at which the second concave sidewall adjoins the bottom surface of the semiconductor channel portion 30. In one embodiment, the radius of curvature R can be the same as the sum of the lateral thickness of the dielectric spacer 56 and the first lateral offset distance lod1, which is the same as the sum of the lateral thickness of the dielectric spacer 56 and the second lateral offset distance lod2. The buried insulator layer 20 includes a planar surface that is adjoined to a bottommost portion of the first concave sidewall and another planar surface that is adjoined to a bottommost portion of the second concave sidewall. The planar surfaces of the buried insulator layer 20 can be parallel to the interface between the vertically protruding portion 20P and the semiconductor channel portion 30.

Figure 18:
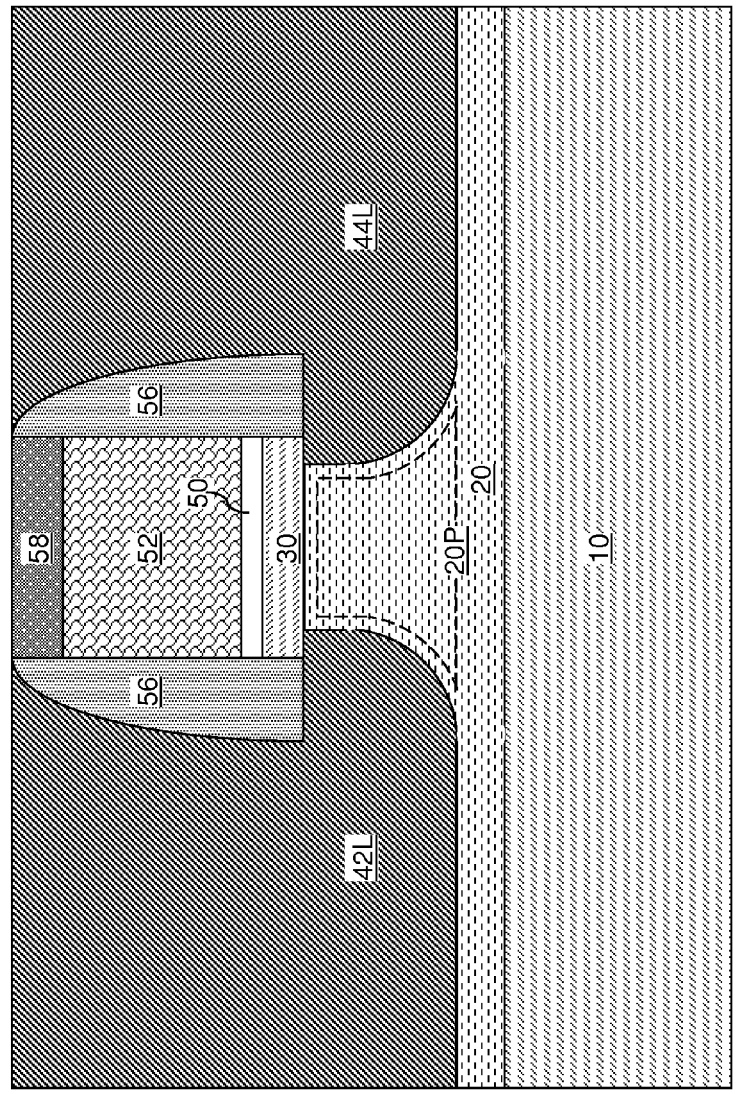
FIG. 18 is a vertical cross-sectional view of a third exemplary semiconductor structure after deposition of epitaxial semiconductor material layers and planarization according to a third embodiment of the present disclosure.

Referring to FIG. 18, a third exemplary semiconductor structure according to a third embodiment of the present disclosure can be derived from the first exemplary structure of FIG. 6 or the second exemplary structure of FIG. 15 by continuing to deposit a doped semiconductor material until the deposited doped semiconductor material grows above the horizontal plane including the top surface of the gate cap dielectric 58. The deposited semiconductor material is subsequently planarized by removing the portion of the deposited semiconductor material from above the horizontal plane including the top surface of the gate cap dielectric 58. The planarization can be performed, for example, by chemical mechanical planarization employing the gate cap dielectric 58 as a stopping layer. The portion of the deposited semiconductor material contacting the first concave surface is herein referred to as a source-side epitaxial semiconductor material layer 42L, and the portion of the deposited semiconductor material contacting the second concave surface is herein referred to as a drain-side epitaxial semiconductor material layer 44L. The source-side epitaxial semiconductor material layer 42L and the drain-side epitaxial semiconductor material layer 44L can include horizontal planar surfaces that are coplanar with the top surface of the gate cap dielectric 58. The source-side epitaxial semiconductor material layer 42L and the drain-side epitaxial semiconductor material layer 44L are epitaxially in contact with the semiconductor channel portion 30.

Figure 19:
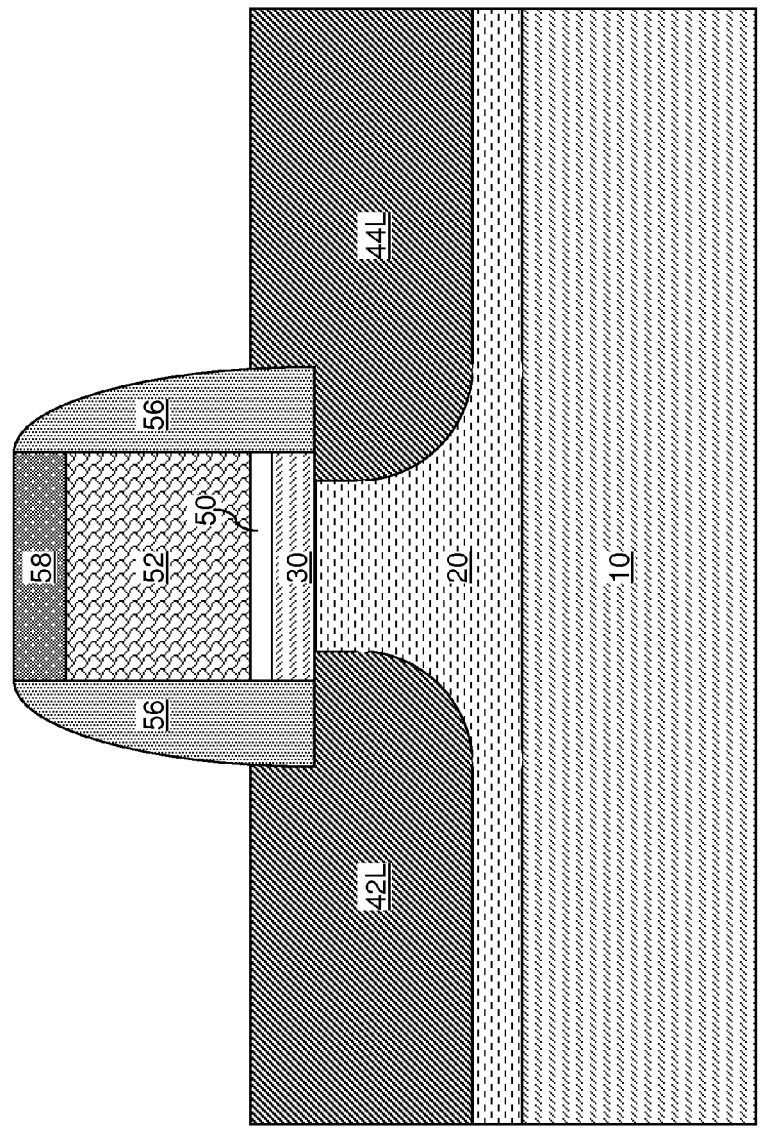
FIG. 19 is a vertical cross-sectional view of the third exemplary semiconductor structure after recessing of the epitaxial semiconductor material layers according to the third embodiment of the present disclosure.

Referring to FIG. 19, the epitaxial semiconductor material layers (42L, 44L) can be vertically recessed by an etch, which can be an isotropic etch or an anisotropic etch. The gate cap dielectric 58 and the dielectric spacer 56 (or the second dielectric spacer 66; See FIG. 15) can be employed as an etch mask. The horizontal top surfaces of the epitaxial semiconductor material layers (42L, 44L) can be recessed to a height that is between the horizontal plane including the bottom surface of the semiconductor channel portion 30 and the top surface of the gate electrode 52.

Figure 20:
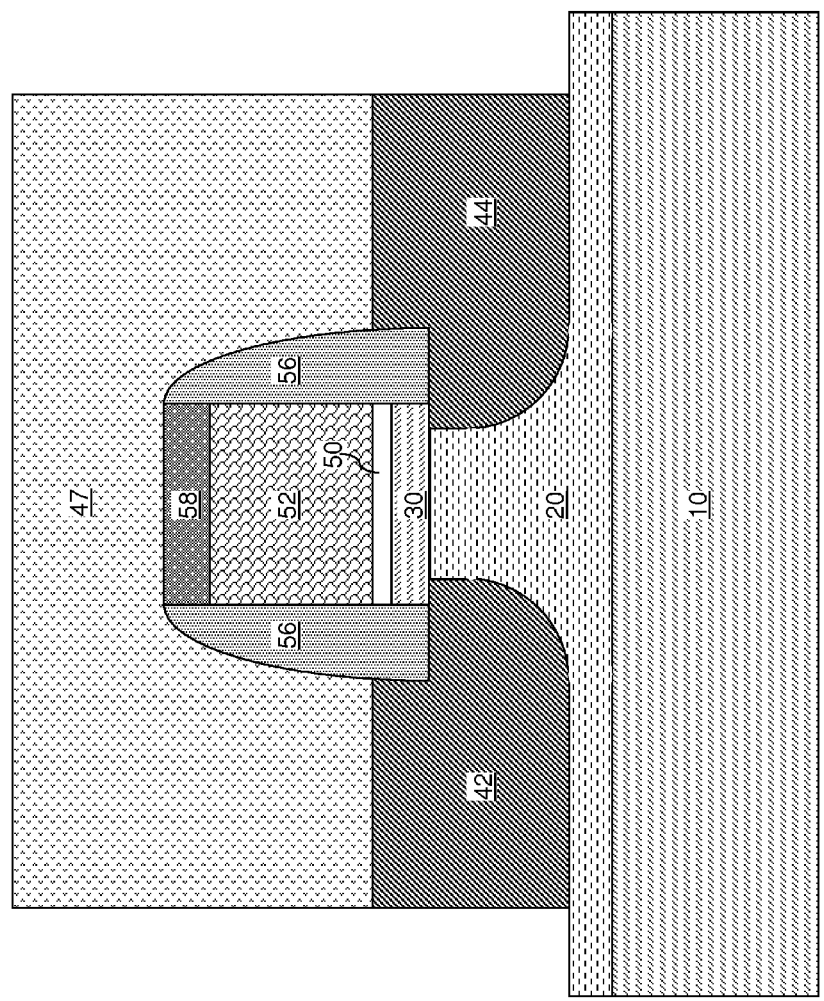
FIG. 20 is a vertical cross-sectional view of the third exemplary semiconductor structure after patterning of epitaxial semiconductor material layers to form buried active epitaxial regions according to the third embodiment of the present disclosure.

Referring to FIG. 20, the epitaxial semiconductor material layers (42L, 44L) can be patterned to form buried active epitaxial regions. For example, a photoresist layer 47 can be applied over the epitaxial semiconductor material layers (42L, 44L), the gate stack (50, 52, 58), and the dielectric spacer 56 (or the second dielectric spacer; See FIG. 15), and lithographically patterned to cover the gate stack (50, 52, 58), the dielectric spacer 56, and portions of the epitaxial semiconductor material layers (42L, 44L) that are proximal to the gate stack (50, 52, 58). The epitaxial semiconductor material layers (42L, 44L) can be anisotropically etched until planar top surfaces of the buried insulator layer 20 are physically exposed in regions not covered by the photoresist layer 47. The buried active epitaxial regions can include an epitaxial source region 42 and an epitaxial drain region 44. A remaining portion of the source-side epitaxial semiconductor material layer 42L is the epitaxial source region 42, and a remaining portion of the drain-side epitaxial semiconductor material layer 44L is the epitaxial drain region 44. Each of the epitaxial source region 42 and the epitaxial drain region 44 can have a planar top surface, a planar bottom surface, and a vertical sidewall.

Figure 21:
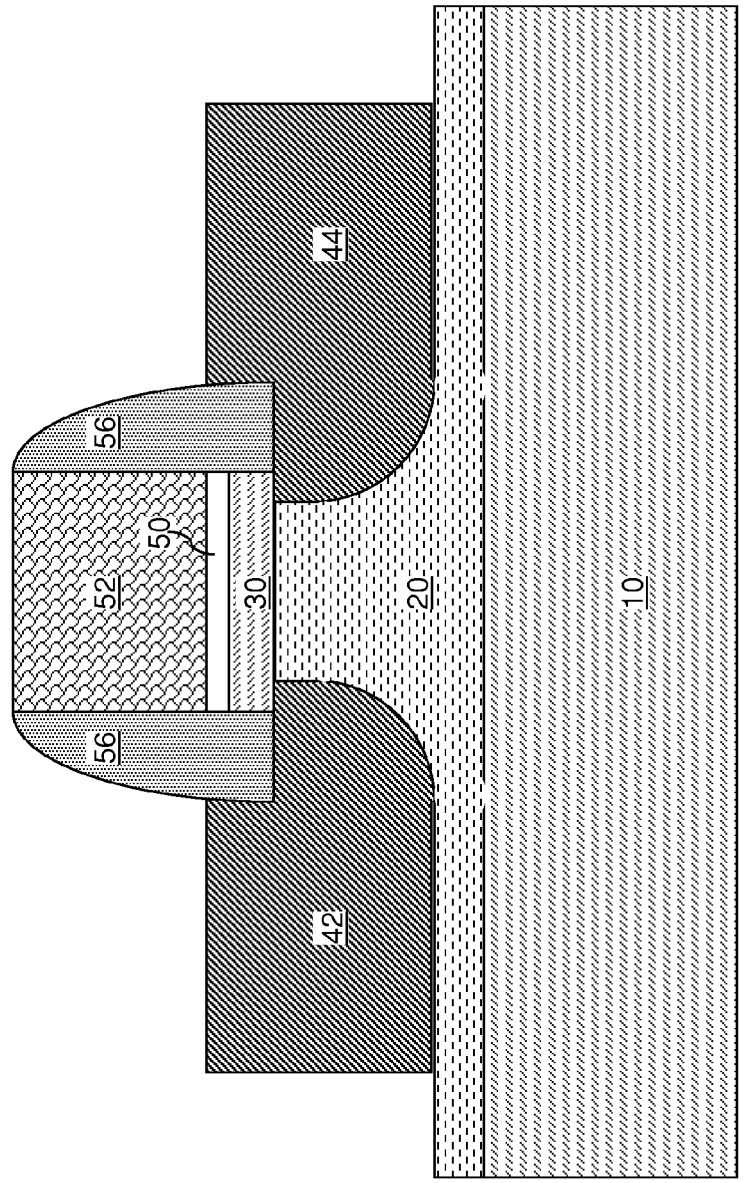
FIG. 21 is a vertical cross-sectional view of the third exemplary semiconductor structure after removal of a gate cap dielectric portion according to the third embodiment of the present disclosure.

Referring to FIG. 21, the photoresist layer 47 can be removed, for example, by ashing.

Figure 22:
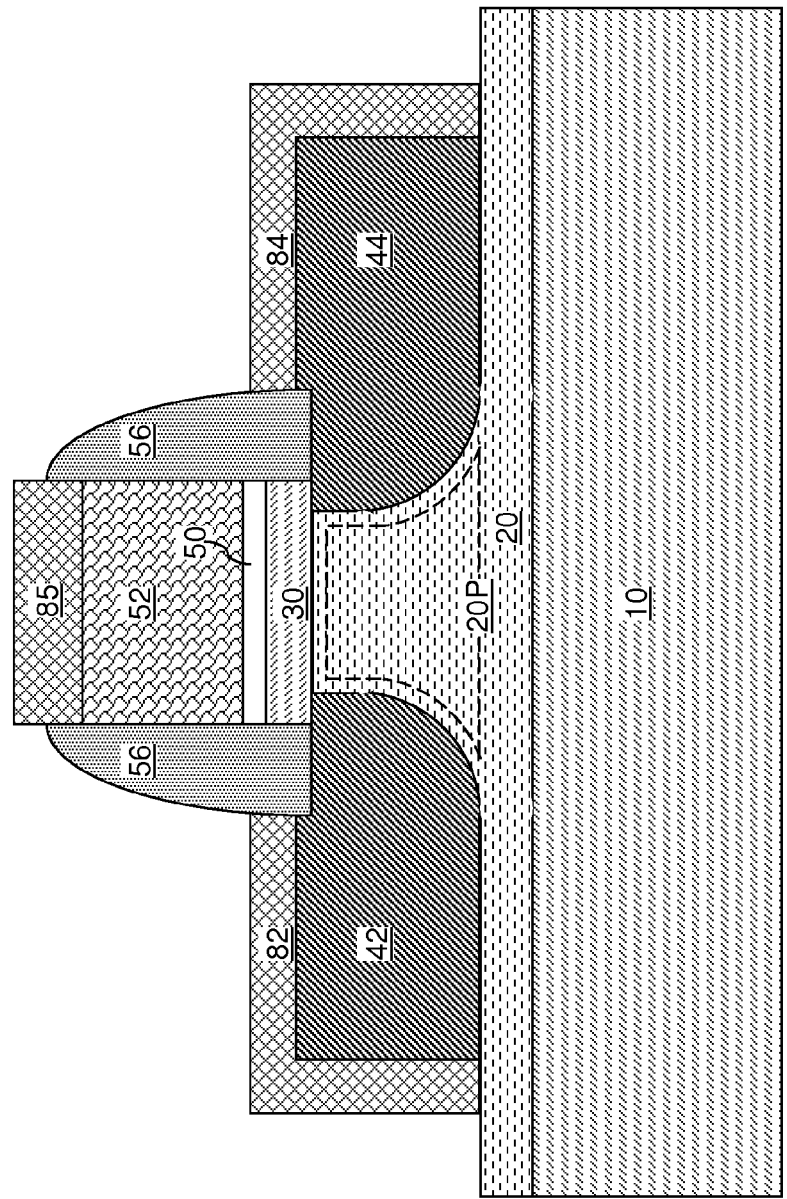
FIG. 22 is a vertical cross-sectional view of the third exemplary semiconductor structure after formation of metal semiconductor alloy regions according to the third embodiment of the present disclosure.

Referring to FIG. 22, metal semiconductor alloy regions can be optionally formed employing the same processing steps as the processing steps of FIG. 8. In one embodiment, the metal semiconductor alloy region can include a source-side metal semiconductor alloy portion 82 that is formed directly on the epitaxial source region 42, a drain-side metal semiconductor alloy portion 84 that is formed directly on the epitaxial drain region 44, and a gate-side metal semiconductor alloy portion 85 that is formed directly on the gate electrode 52. A contact level dielectric material layer (not shown) can be subsequently deposited, and various contact via structures (not shown) can be formed therein to provide conductive paths to the metal semiconductor alloy regions (42, 44, 45) through the contact level dielectric material layer. After formation of the metal semiconductor alloy regions (82, 84, 85), each of the epitaxial source region 42 and the epitaxial drain region can have a planar top surface, a planar bottom surface, and a vertical sidewall. The source-side metal semiconductor alloy portion 82 and the drain-side metal semiconductor alloy portion 84 can contact a planar top surface of the buried insulator layer 20.

Figure 23:
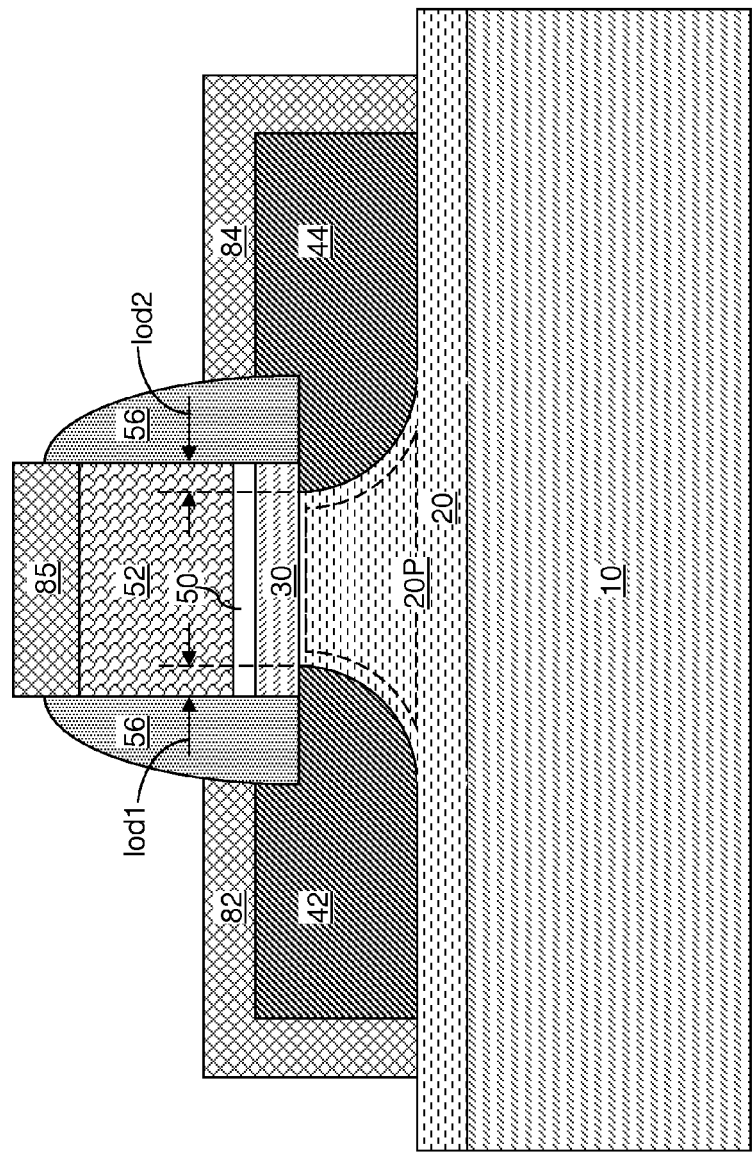
FIG. 23 is a vertical cross-sectional view of a variation of the third exemplary semiconductor structure according to the third embodiment of the present disclosure.

Referring to FIG. 23, a variation of the third exemplary semiconductor structure can be derived from the third exemplary semiconductor structure by omitting the processing step of FIG. 4 or FIG. 13. A first lateral offset distance lod1 between a first sidewall of the semiconductor channel portion 30 contacting the epitaxial source region 42 and an edge at which the first concave sidewall adjoins the bottom surface of the semiconductor channel portion 30 can be the same as a second lateral offset distance lod2 between a second sidewall of the semiconductor channel portion 30 contacting the epitaxial drain region 44 and an edge at which the second concave sidewall adjoins the bottom surface of the semiconductor channel portion 30. In one embodiment, the radius of curvature R can be the same as the sum of the lateral thickness of the dielectric spacer 56 and the first lateral offset distance lod1, which is the same as the sum of the lateral thickness of the dielectric spacer 56 and the second lateral offset distance lod2. The buried insulator layer 20 includes a planar surface that is adjoined to a bottommost portion of the first concave sidewall and another planar surface that is adjoined to a bottommost portion of the second concave sidewall. The planar surfaces of the buried insulator layer 20 can be parallel to the interface between the vertically protruding portion 20P and the semiconductor channel portion 30.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising:
an insulator layer comprising a vertically protruding portion;
a semiconductor channel portion having a uniform thickness, contacting a top surface of said vertically protruding portion, and laterally protruding outward from a periphery of said top surface of said vertically protruding portion;
a gate stack including, from bottom to top, of a gate dielectric and a gate electrode and contacting a top surface of said semiconductor channel portion;
a dielectric spacer having a bottom surface that is coplanar with an interface between said vertically protruding portion and said semiconductor channel portion;
an epitaxial source region contacting a first concave sidewall of said vertically protruding portion and epitaxially in contact with said semiconductor channel portion; and
an epitaxial drain region contacting a second concave sidewall of said vertically protruding portion and epitaxially in contact with said semiconductor channel portion.

2. The semiconductor structure of claim 1, wherein said first concave sidewall and said second concave sidewall have a same radius of curvature.

3. The semiconductor structure of claim 1, wherein said dielectric spacer comprises a dielectric material different from a dielectric material of said insulator layer.

4. The semiconductor structure of claim 1, wherein said insulator layer comprises a planar surface that is adjoined to a bottommost portion of one of said first and second concave sidewalls and is parallel to an interface between said vertically protruding portion and said semiconductor channel portion.

5. The semiconductor structure of claim 1, wherein a topmost portion of said epitaxial source region is located above a horizontal plane including an interface between said vertically protruding portion and said semiconductor channel portion, and a topmost portion of said epitaxial drain region is located above said horizontal plane.

6. The semiconductor structure of claim 1, wherein said vertically protruding portion has a variable horizontal cross-sectional area that increases with distance from an interface between said vertically protruding portion and said semiconductor channel portion.

7. The semiconductor structure of claim 1, wherein a lateral offset distance between a first sidewall of said semiconductor channel portion and an edge at which a sidewall of said vertically protruding portion adjoins a bottom surface of said semiconductor channel portion is the same as another lateral offset distance between a second sidewall of said semiconductor channel portion and an edge at which another sidewall of said vertically protruding portion adjoins said bottom surface of said semiconductor channel portion.

8. The semiconductor structure of claim 1, wherein sidewalls of said semiconductor channel portion are vertically coincident with sidewalls of said gate stack.

9. The semiconductor structure of claim 1, wherein sidewalls of said semiconductor channel portion are laterally offset outward with respect to sidewalls of said gate stack.

10. A semiconductor structure comprising:
an insulator layer comprising a vertically protruding portion;
a semiconductor channel portion having a uniform thickness, contacting a top surface of said vertically protruding portion, and laterally protruding outward from a periphery of said top surface of said vertically protruding portion;
a gate stack including, from bottom to top, of a gate dielectric and a gate electrode and contacting a top surface of said semiconductor channel portion, wherein sidewalls of said semiconductor channel portion are laterally offset outward with respect to sidewalls of said gate stack;
an epitaxial source region contacting a first concave sidewall of said vertically protruding portion and epitaxially in contact with said semiconductor channel portion;
an epitaxial drain region contacting a second concave sidewall of said vertically protruding portion and epitaxially in contact with said semiconductor channel portion;
a first dielectric spacer having a bottom surface that contacts a top surface of said semiconductor channel portion; and
a second dielectric spacer having a bottom surface that is coplanar with a horizontal plane including an interface between said semiconductor channel portion and said vertically protruding portion.

11. The semiconductor structure of claim 10, further comprising a dielectric spacer having a bottom surface that is coplanar with an interface between said vertically protruding portion and said semiconductor channel portion.

12. A method of forming a semiconductor structure comprising:
forming a gate stack over a semiconductor-on-insulator (SOI) substrate including a top semiconductor layer, a buried insulator layer, and a handle substrate;
forming a semiconductor channel portion by patterning said top semiconductor layer, wherein said semiconductor channel portion underlies said gate stack and a top surface of said buried insulator layer is physically exposed in regions not covered by said semiconductor channel portion;
forming a dielectric spacer around said gate stack and said semiconductor channel portion;
performing an isotropic etch of said buried insulator layer employing said dielectric spacer as an etch mask, wherein peripheral regions of a bottom surface of said semiconductor channel portion are physically exposed, wherein a remaining portion of said buried insulator layer after said isotropic etch comprises a horizontal portion that contact a top surface of said handle substrate and a vertically protruding portion that protrudes above said horizontal portion and contacting said semiconductor channel portion, and wherein said dielectric spacer has a bottom surface that is coplanar with an interface between said vertically protruding portion and said semiconductor channel portion; and
depositing a semiconductor material directly on said physically exposed peripheral regions of said bottom surface of said semiconductor channel portion.

13. The method of claim 12, wherein said deposition of said semiconductor material is performed by a selective epitaxy process that deposits said semiconductor material on semiconductor surfaces and does not deposit any semiconductor material on dielectric surfaces.

14. The method of claim 12, wherein said horizontal portion of said remaining portion of said buried insulator layer has a uniform thickness.

15. The method of claim 14, wherein said selective epitaxy process simultaneously forms an epitaxial source region that contacts a first concave sidewall of said vertically protruding portion and epitaxially in contact with said semiconductor channel portion, and an epitaxial drain region that contacts a second concave sidewall of said vertically protruding potion and epitaxially in contact with said semiconductor channel portion.

16. The method of claim 14, wherein said epitaxial source region and said epitaxial drain region are epitaxially grown to a height above a horizontal plane including an interface between said semiconductor channel portion and said vertically protruding portion, and said method further comprises forming a metal semiconductor alloy region on each of said epitaxial source region and said epitaxial drain region.

17. The method of claim 14, wherein said selective epitaxy process simultaneously forms epitaxial semiconductor material layers that include single crystalline semiconductor materials that are epitaxially in contact with said semiconductor channel portion, and said method further comprises:
   planarizing said epitaxial semiconductor material layers to provide planar top surfaces;
   patterning said epitaxial semiconductor material layers into an epitaxial source region and an epitaxial drain region; and
   forming a metal semiconductor alloy region on each of said epitaxial source region and said epitaxial drain region.

18. The method of claim 12, wherein said top semiconductor layer is patterned such that sidewalls of said semiconductor channel portion are vertically coincident with sidewalls of said gate stack.

19. The method of claim 12, wherein said top semiconductor layer is patterned such that sidewalls of said semiconductor channel portion are laterally offset outward with respect to sidewalls of said gate stack.

20. The method of claim 19, further comprising forming an inner dielectric spacer around sidewalls of said gate stack prior to patterning said top semiconductor layer, wherein said top semiconductor layer is patterned such that sidewalls of said semiconductor channel portion is vertically coincident with outermost portions of sidewalls of said inner dielectric spacer.

* * * * *